(12) United States Patent
Hayashi et al.

(10) Patent No.: US 9,036,061 B2
(45) Date of Patent: May 19, 2015

(54) COLOR IMAGING APPARATUS

(71) Applicant: FUJIFILM Corporation, Tokyo (JP)

(72) Inventors: Kenkichi Hayashi, Saitama (JP); Seiji Tanaka, Saitama (JP); Tomoyuki Kawai, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/314,273

(22) Filed: Jun. 25, 2014

(65) Prior Publication Data

US 2014/0307140 A1  Oct. 16, 2014

Related U.S. Application Data

(63) Continuation of application No. PCT/JP2012/083839, filed on Dec. 27, 2012.

(30) Foreign Application Priority Data

Dec. 27, 2011  (JP) ................................ 2011-286007

(51) Int. Cl.
*H04N 9/083* (2006.01)
*H01L 27/146* (2006.01)
(Continued)

(52) U.S. Cl.
CPC ............ *H01L 27/14621* (2013.01); *H04N 9/07* (2013.01); *H04N 9/045* (2013.01); *H04N 5/378* (2013.01)

(58) Field of Classification Search
CPC .... H04N 9/045; H04N 9/07; H04N 2209/045
USPC ........................... 348/266, 272, 273, 275, 280
See application file for complete search history.

(56) References Cited

U.S. PATENT DOCUMENTS 6,236,434 B1  5/2001 Yamada
6,522,356 B1 * 2/2003 Watanabe ...................... 348/272
(Continued)

FOREIGN PATENT DOCUMENTS

CN  101854488 A  10/2010
JP  58-219889 A  12/1983
(Continued)

OTHER PUBLICATIONS

International Search Report issued in PCT/JP2012/083839, mailed on Jan. 29, 2013.
(Continued)

*Primary Examiner* — Timothy J Henn
(74) *Attorney, Agent, or Firm* — Birch, Stewart, Kolasch & Birch, LLP

(57) ABSTRACT

A single-plate color imaging element where the color filter array includes a basic array pattern with first filters corresponding to a first color and second filters corresponding to a second color with contribution ratios for obtaining luminance signals lower than the first color, the basic array pattern is repeatedly arranged in a diagonal grid shape, one or more first filters are arranged in horizontal, vertical, upper right, and lower right directions of the color filter array, one or more second filters corresponding to each color of the second color are arranged in the upper right and lower right directions of the color filter array in the basic array pattern, and a proportion of the number of pixels of the first color corresponding to the first filters is greater than a proportion of the number of pixels of each color of the second color corresponding to the second filters.

11 Claims, 20 Drawing Sheets

(51) Int. Cl.
*H04N 9/07* (2006.01)
*H04N 9/04* (2006.01)
*H04N 5/378* (2011.01)

(56) References Cited

U.S. PATENT DOCUMENTS

| | | | | |
|---|---|---|---|---|
| 6,657,755 | B1* | 12/2003 | Campbell | 358/514 |
| 7,202,900 | B2* | 4/2007 | Glenn | 348/315 |
| 7,372,488 | B2* | 5/2008 | Kubo | 348/266 |
| 7,465,910 | B2* | 12/2008 | Yamada | 250/208.1 |
| 7,570,290 | B2* | 8/2009 | Yokota et al. | 348/275 |
| 7,612,812 | B2* | 11/2009 | Yamada | 348/275 |
| 7,825,970 | B2* | 11/2010 | Choi et al. | 348/275 |
| 7,952,636 | B2* | 5/2011 | Ikeda et al. | 348/311 |
| 7,961,239 | B2* | 6/2011 | Lee | 348/308 |
| 8,111,298 | B2* | 2/2012 | Kameya | 348/222.1 |
| 8,350,940 | B2* | 1/2013 | Smith et al. | 348/308 |
| 8,520,103 | B2* | 8/2013 | Hirota | 348/275 |
| 8,723,994 | B2* | 5/2014 | Massetti | 348/275 |
| 2002/0149686 | A1 | 10/2002 | Taubman | |
| 2004/0109068 | A1 | 6/2004 | Mitsunaga et al. | |
| 2004/0169747 | A1 | 9/2004 | Ono et al. | |
| 2006/0012808 | A1 | 1/2006 | Mizukura et al. | |
| 2006/0203113 | A1 | 9/2006 | Wada et al. | |
| 2007/0153104 | A1 | 7/2007 | Ellis-Monaghan et al. | |
| 2007/0171290 | A1* | 7/2007 | Kroger | 348/272 |
| 2008/0131028 | A1 | 6/2008 | Pillman et al. | |
| 2008/0151083 | A1 | 6/2008 | Hains et al. | |
| 2009/0059051 | A1 | 3/2009 | Sakamoto | |
| 2011/0069189 | A1 | 3/2011 | Venkataraman et al. | |
| 2012/0025060 | A1 | 2/2012 | Iwata | |

FOREIGN PATENT DOCUMENTS

| | | |
|---|---|---|
| JP | 8-023542 A | 1/1996 |
| JP | 8-023543 A | 1/1996 |
| JP | 10-136391 A | 5/1998 |
| JP | 11-285012 A | 10/1999 |
| JP | 2000-308080 A | 11/2000 |
| JP | 2003-284084 A | 10/2003 |
| JP | 2004-221839 A | 8/2004 |
| JP | 2004-266369 A | 9/2004 |
| JP | 2005-136766 A | 5/2005 |
| JP | 2007-184904 A | 7/2007 |
| JP | 2007-306490 A | 11/2007 |
| JP | 2008-236620 A | 10/2008 |
| JP | 2009-060342 A | 3/2009 |
| JP | 2010-512048 A | 4/2010 |
| JP | 2010-153511 A | 7/2010 |
| JP | 2011-523538 A | 8/2011 |
| WO | WO 02/056604 A1 | 7/2002 |
| WO | WO 2008/066698 A2 | 6/2008 |
| WO | WO 2009/151903 A2 | 12/2009 |

OTHER PUBLICATIONS

Office Action issued in Chinese Patent Application No. 201180022503.3, issued on May 23, 2013.

Written Opinion of the International Searching Authority issued in PCT/JP2012/080898, mailed on Jan. 22, 2013.

Written Opinion of the International Searching Authority issued in PCT/JP2012/080899, mailed on Jan. 15, 2013.

Written Opinion of the International Searching Authority issued in PCT/JP2012/081644, mailed on Jan. 15, 2013.

Written Opinion of the International Searching Authority issued in PCT/JP2012/083583, mailed on Jan. 29, 2013.

Written Opinion of the International Searching Authority issued in PCT/JP2012/083839, mailed on Jan. 29, 2013.

Chinese Office Action, dated Feb. 27, 2015, in related application No. CN201280064976.

* cited by examiner

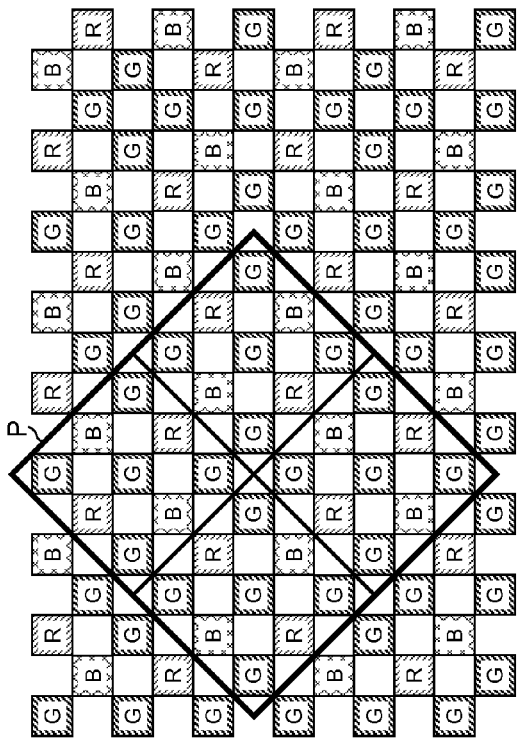
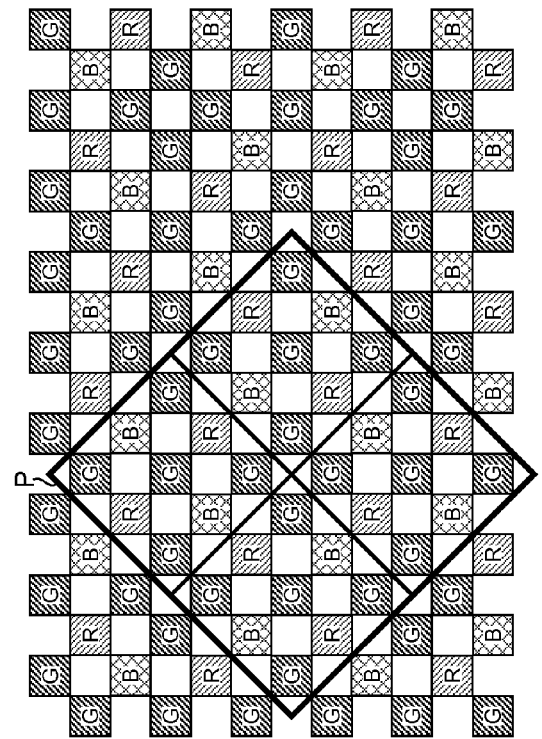
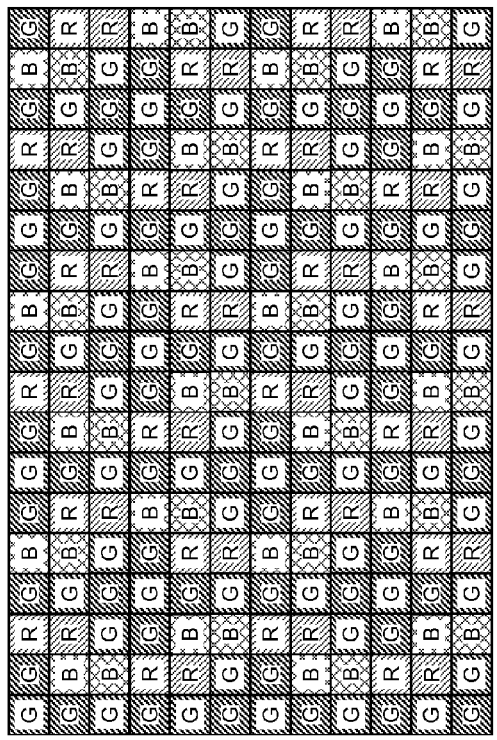
FIG.15

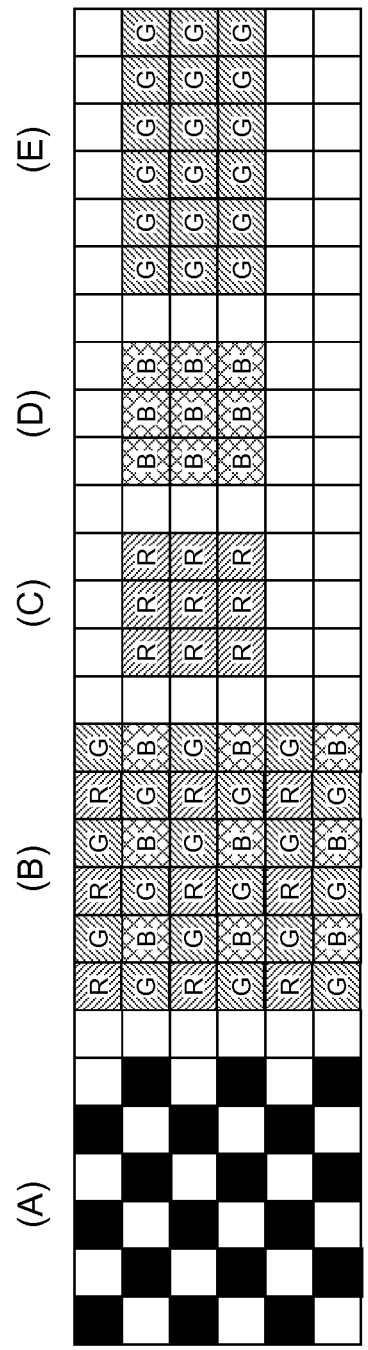

COLOR IMAGING APPARATUS

CROSS-REFERENCE TO RELATED APPLICATIONS

This application is a Continuation of PCT International Application No. PCT/JP2012/083839 filed on Dec. 27, 2012, which claims priority under 35 U.S.C. §119(a) to Japanese Patent Application No. 2011-286007 filed on Dec. 27, 2011. Each of the above application(s) is hereby expressly incorporated by reference, in its entirety, into the present application.

BACKGROUND OF THE INVENTION

1. Field of the Invention

The present invention relates to a color imaging element, and particularly, to a color imaging element that can decrease generation of color moire and increase resolution.

2. Description of the Related Art

An output image of a single-plate color imaging element is a RAW image (mosaic image). Therefore, a multi-channel image is obtained by a process of interpolating (demosaicing processing) a pixel of a missing color from a surrounding pixel. In this case, there is a problem in reproduction characteristics of a high-frequency image signal. Compared to a black and white imaging element, aliasing easily occurs in an image taken by a color imaging element, and it is important to expand a reproduction band to increase resolution while decreasing generation of color moire (false color).

The demosaicing process is a process of calculating all color information of each pixel from a mosaic image corresponding to a color filter array of the single-plate color imaging element and is also called synchronization processing. For example, in a case of an imaging element including color filters of three RGB colors, the color information of all of RGB is calculated in the process for each pixel from the mosaic image made of RGB.

A primary-color Bayer array as a color array most widely used in the single-plate color imaging element includes green (G) pixels arranged in a check pattern and red (R) and blue (B) arranged line-sequentially. Therefore, G signals have a problem of reproduction accuracy in generation of high frequency signals in oblique directions, and R and B signals have a problem of reproduction accuracy in generation of high frequency signals in horizontal and vertical directions.

A black and white vertical-striped pattern (high frequency image) as shown in (A) portion of FIG. 19 enters an imaging element in a Bayer array shown in (B) portion of FIG. 19, and the pattern is sorted into Bayer color arrays to compare the colors. As shown in (C) to (E) portions of FIG. 19, R forms a light and flat color image, B forms a dark and flat color image, and G forms a light and dark mosaic color image. Although there is no density difference (level difference) between RGB with respect to the original black and white image, the image is colored depending on the color array and the input frequency.

Similarly, a black and white oblique high frequency image as shown in (A) portion of FIG. 20 enters an imaging element in a Bayer array shown in (B) portion of FIG. 20, and the image is sorted into Bayer color arrays to compare the colors. As shown in (C) to (E) portions of FIG. 20, R and B form light and flat color images, while G forms a dark and flat color image. Assuming that the value of black is 0 and the value of white is 255, the black and white oblique high frequency image turns green, because only G is 255. In this way, an oblique high frequency image cannot be correctly reproduced in the Bayer array.

In the imaging apparatus using the single-plate color imaging element, an optical low-pass filter formed by an anisotropic substance such as crystal is generally arranged on the front side of the color imaging element to prevent optically reducing the high frequency wave. However, although the coloring caused by folding of the high frequency signal can be reduced in the method, there is a problem that the resolution is reduced accordingly.

To solve the problem, a color imaging element is proposed, wherein a color filter array of the color imaging element is a three-color random array satisfying array restrictions in which an arbitrary target pixel is adjacent to three colors including the color of the target pixel on four sides of the target pixel (Japanese Patent Application Laid-Open No. 2000-308080; PTL 1).

An image sensor of a color filter array is also proposed, wherein the image sensor includes a plurality of filters with different spectral sensitivity, and first and second filters among the plurality of filters are alternately arranged in a first predetermined period in one of the diagonal directions of a pixel grid of the image sensor and are alternately arranged in a second predetermined period in the other diagonal direction (Japanese Patent Application Laid-Open No. 2005-136766; PTL 2).

A color array is further proposed, wherein in a color solid-state imaging element of three primary colors of RGB, sets of three pixels including horizontally arranged R, G, and B are arranged in a zigzag manner in the vertical direction to make appearance frequencies of RGB equal and to cause arbitrary lines (horizontal, vertical, and oblique lines) on an imaging plane to pass through all colors (Japanese Patent Application Laid-Open No. 11-285012; PTL 3).

Furthermore, a color imaging element is also proposed, wherein R and B among the three primary colors of RGB are arranged every three pixels in horizontal and vertical directions, and G is arranged between R and B (Japanese Patent Application Laid-Open No. 8-23543; PTL 4).

A color imaging element is also proposed, wherein pixels are arranged in a diagonal grid shape (adjacent pixels on horizontal lines are arranged at a ½ pixel pitch), and lines with only G pixels and lines with repeated R, B pixels or B, R pixels are alternately arranged (Japanese Patent Application Laid-Open No. 10-136391; PTL 5).

A color imaging element is further proposed, the color imaging element including a plurality of pixels formed by photoelectric conversion elements arranged in a square grid shape and including a first pixel group and a second pixel group arranged in a checked grid shape, wherein color filters in the same color filter array as in PTL 5 are arranged for the first and second pixel groups (Japanese Patent Application Laid-Open No. 2009-60342; PTL 6). According to the imaging element, an image corresponding to the first pixel group and an image corresponding to the second group can be acquired at the same time by changing the exposure conditions, and the images can be combined to generate a wide dynamic image.

SUMMARY OF THE INVENTION

In the color imaging element described in PTL 1, the filter arrays are random, and each random pattern needs to be optimized in a demosaicing process in a later stage. There is a problem that the demosaicing process becomes cumbersome. Although the random arrays are effective for color moire in a low frequency wave, the random arrays are not effective for a false color at a high frequency section.

In the image sensor described in PTL 2, the G pixels (luminance pixels) are arranged in a check pattern. Therefore, there is a problem that the pixel reproduction accuracy in a limit resolution area (particularly in oblique direction) is not excellent.

The color solid-state imaging element described in PTL 3 includes filters of all colors on arbitrary lines and has an advantage that the generation of false color can be suppressed. However, the proportions of the numbers of pixels of RGB are equal, and there is a problem that the high frequency reproducibility is lower than that in a Bayer array. In the Bayer array, the proportion of the number of pixels of G that most contributes to obtaining luminance signals is twice the proportions of the numbers of pixels of R and B.

Meanwhile, in the color imaging element described in PTL 4, the proportion of the number of pixels of G with respect to the numbers of pixels of R and B is greater than that in the Bayer array, and there are lines with only G pixels in the horizontal or vertical direction. Therefore, the color imaging element is not effective for the false color at a high frequency section in the horizontal or vertical direction.

The color filter array of the color imaging elements described in PTL 5 and 6 corresponds to a general Bayer array rotated by 45°. Therefore, the color filter array has the flaws of the Bayer arrays described in FIGS. 19 and 20.

The present invention has been made in view of the circumstances, and an object of the present invention is to provide a color imaging element that can decrease the generation of false color and increase the resolution and that can simplify the process of a later stage compared to the conventional random array.

To attain the object, an invention according to an aspect of the present invention provides a single-plate color imaging element including color filters in a specific color filter array arranged on a plurality of pixels formed by photoelectric conversion elements arranged in a diagonal grid shape, wherein the color filter array includes a basic array pattern provided with first filters corresponding to a first color with one or more colors and second filters corresponding to a second color with two or more colors with contribution ratios for obtaining luminance signals lower than the first color, the basic array pattern is repeatedly arranged in a diagonal grid shape, one or more first filters are arranged in each line in horizontal, vertical, upper right, and lower right directions of the color filter array, one or more second filters corresponding to each color of the second color are arranged in each line in the upper right and lower right directions of the color filter array in the basic array pattern, and a proportion of the number of pixels of the first color corresponding to the first filters is greater than a proportion of the number of pixels of each color of the second color corresponding to the second filters.

According to the color imaging element of the aspect of the present invention, the first color corresponding to the first color with a high distribution ratio for obtaining luminance signals are arranged in each line in the horizontal, vertical, upper right, and lower right directions of the color filter array. Therefore, the reproduction accuracy of a demosaicing process in a high frequency area can be improved. Furthermore, one or more second filters corresponding to a second color with two or more colors other than the first color are arranged in each line in the upper right and lower right directions of the color filter array. This can reduce the generation of color moire (false color) to increase the resolution.

In the color filter array, the basic array pattern is repeatedly arranged in diagonal grid shape. Therefore, the demosaicing processing in a later stage can be executed according to the repeated pattern, and the processing in the later stage can be simplified compared to the conventional random array.

Furthermore, the proportion of the number of pixels of the first color corresponding to the first filters and the proportion of the number of pixels of each color of the second color corresponding to the second filters are different, and particularly, the proportion of the number of pixels of the first color with a high contribution ratio for obtaining the luminance signals is greater than the proportion of the number of pixels of each color of the second color corresponding to the second filters. Therefore, aliasing can be suppressed, and high frequency reproducibility is excellent.

An invention according to another aspect of the present invention provides a single-plate color imaging element, wherein a plurality of pixels formed by photoelectric conversion elements arranged in a square grid shape are sorted into a first pixel group and a second pixel group arranged in a checked grid shape, the first pixel group and the second pixel group are provided with color filters in a same specific color filter array, the color filter array includes a basic array pattern provided with first filters corresponding to a first color with one or more colors and second filters corresponding to a second color with two or more colors with contribution ratios for obtaining luminance signals lower than the first color, the basic array pattern is repeatedly arranged in a diagonal grid shape, one or more first filters are arranged in each line in horizontal, vertical, upper right, and lower right directions of the color filter array, one or more second filters corresponding to each color of the second color are arranged in each line in the upper right and lower right directions of the color filter array in the basic array pattern, and a proportion of the number of pixels of the first color corresponding to the first filters is greater than a proportion of the number of pixels of each color of the second color corresponding to the second filters.

Although the pixel groups of the color imaging element including the first pixel group and the second pixel group are arranged in the square grid shape, the first pixel group and the second pixel group are arranged in the checked grid shape (diagonal grid shape).

Although the color filters on the first pixel group and the color filters on the second pixel group are shifted at one pixel pitch in the horizontal or vertical direction, color filters of the same color filter array are arranged. The color filter arrays are the same arrays as in one aspect of the present invention. Therefore, the reproduction accuracy of the demosaicing process in a high frequency area can be improved, and the generation of color moire (false color) can be reduced to increase the resolution. An image (first image) formed by the first pixel group and an image (second image) formed by the second pixel group can be acquired at the same time by changing the exposure conditions, and the first and second images can be combined to generate a wide dynamic image.

It is preferable that in the color imaging element according to another aspect of the present invention, the color filter array includes a section where the first filters continue for two or more pixels in each line in the horizontal, vertical, upper right, and lower right directions.

As a result, the direction with a small change in luminance (direction with high correlation) among the horizontal, vertical, upper right, and lower right directions can be determined at minimum pixel intervals.

It is preferable that in the color imaging element according to another aspect of the present invention, the color filter array includes a cross shape array including vertically and horizontally adjacent four pixels formed by the first filters. The pixel values of the four pixels arranged in the cross shape can be used to determine the direction with high correlation among the horizontal, vertical, upper right, and lower right directions.

Preferably, in the color imaging element according to another aspect of the present invention, the color filter array in the basic array pattern is point-symmetric with respect to a center of the basic array pattern. As a result, the circuit size of the processing circuit in a later stage can be reduced.

Preferably, in the color imaging element according to another aspect of the present invention, the basic array pattern is a diagonal grid array pattern corresponding to N×N (N: integer 4 or more and 8 or less) pixels.

The diagonal grid array pattern corresponding to N×N pixels is an array pattern in a rhombic shape including N pixels in each of the oblique directions. This is because if the number of pixels N in the oblique directions of the diagonal grid array pattern is smaller than 4, conditions of the color filter array according to the present invention are not satisfied. If N exceeds 8, signal processing such as a demosaicing process becomes complicated, and an advantageous effect cannot be particularly obtained by increasing the size of the basic array pattern.

It is preferable that in the color imaging element according to another aspect of the present invention, the basic array pattern is a diagonal grid array pattern corresponding to 6×6 pixels.

As described, it is preferable that the basic array pattern is a diagonal grid array pattern corresponding to N×N pixels, and N is an integer 4 or more and 8 or less. It is more advantageous in the demosaicing process when N is an even number, compared to when N is an odd number. If N is 4, the basic array pattern does not include a section where the first filters continue for two or more pixels in each line in the horizontal, vertical, upper right, and lower right directions, and this is disadvantageous in determining the direction with a small change in luminance. If N is 8, the signal processing becomes more complicated, compared to when N is 6. Therefore, it is most preferable that the basic array pattern is a diagonal grid array pattern in which N is 6, that is, a diagonal grid array pattern corresponding to 6×6 pixels.

It is preferable that in the color imaging element according to another aspect of the present invention, the color filter array includes the first filters arranged at a center and four corners in a diagonal grid array of 3×3 pixels, and the diagonal grid array of 3×3 pixels is repeatedly arranged in a diagonal grid shape. The first filters are arranged at the four corners of the 3×3 pixel group. Therefore, when the 3×3 pixel group is repeatedly arranged in a diagonal grid shape, the color filter array includes a diagonal grid array corresponding to 2×2 pixels formed by the first filters. The pixel values of the 2×2 pixels can be used to determine the direction with high correlation among the horizontal, vertical, upper right, and lower right directions.

In the color imaging element according to another aspect of the present invention, the second filters may be arranged in each line in the horizontal, vertical, upper right, and lower right directions of the color filter array. As a result, the color reproducibility in the horizontal and vertical directions can be further improved.

In the color imaging element according to another aspect of the present invention, the first color is green (G), and the second color is red (R) and blue (B).

It is preferable that in the color imaging element according to another aspect of the present invention, the basic array pattern is a diagonal grid array pattern corresponding to 6×6 pixels, and the diagonal grid array pattern includes alternately arranged first diagonal grid arrays and second diagonal grid arrays, the first diagonal grid array corresponding to 3×3 pixels, the first diagonal grid array including G filters arranged at a center and four corners, the first diagonal grid array including B filters arranged in the upper right direction across the G filter at the center, the first diagonal grid array including R filters arranged in the lower right direction, the second diagonal grid array corresponding to 3×3 pixels, the second diagonal grid array including G filters arranged at a center and four corners, the second diagonal grid array including R filters arranged in the upper right direction across the G filter at the center, the second diagonal grid array including B filters arranged in the lower right direction.

The basic array pattern includes G filters in a diagonal grid array corresponding to 2×2 pixels, and the basic array pattern is in a minimum size that is point-symmetric with respect to the center of the basic array pattern. According to the color filter array with the configuration, there are G pixels of 2×2 pixels in the diagonal grid shape at four corners of 5×5 pixels in the diagonal grid shape (local area of mosaic image) when the 5×5 pixels are extracted around the first or second diagonal grid array. The pixel values of the G pixels of the 2×2 pixels can be used to determine the correlation direction of four directions. An imaging apparatus including the color imaging element is also included in the present invention.

According to the present invention, the first filters corresponding to the first color with a high contribution ratio for obtaining the luminance signals are arranged in each line in the horizontal, vertical, upper right, and lower right directions of the color filter array, and the proportion of the number of pixels of the first color corresponding to the first filters is greater than the proportions of the numbers of pixels of the second color with two or more colors other than the first color corresponding to the second filters. Therefore, the reproduction accuracy of the demosaicing process in the high frequency area can be improved, and aliasing can be suppressed.

One or more second filters corresponding to a second color with two or more colors other than the first color are arranged in each line in the upper right and lower right directions of the color filter array in the basic array pattern. Therefore, the generation of color moire (false color) can be reduced to increase the resolution.

In the color filter array according to the present invention, the basic array pattern is repeated in the diagonal grid shape. Therefore, the demosaicing process in the later stage can be executed according to the repeated pattern, and the process in the later stage can be simplified compared to the conventional random array.

BRIEF DESCRIPTION OF THE DRAWINGS

FIG. 6 is a diagram showing a second embodiment of the color imaging element.

FIG. 7 is a diagram showing a third embodiment of the color imaging element.

FIG. 8 is a diagram showing a fourth embodiment of the color imaging element.

FIG. 9 is a diagram showing a fifth embodiment of the color imaging element.

FIG. 11 is a diagram showing a seventh embodiment of the color imaging element.

FIG. 12 is a diagram showing an eighth embodiment of the color imaging element.

FIG. 15 is a diagram showing a tenth embodiment of the color imaging element.

FIG. 20 is another diagram used to explain a problem of a color imaging element with color filters in a conventional Bayer array.

DETAILED DESCRIPTION OF THE PREFERRED EMBODIMENTS

Hereinafter, preferred embodiments of the present invention will be described in detail with reference to the attached drawings.

First Embodiment of Color Imaging Element

Figure 1:
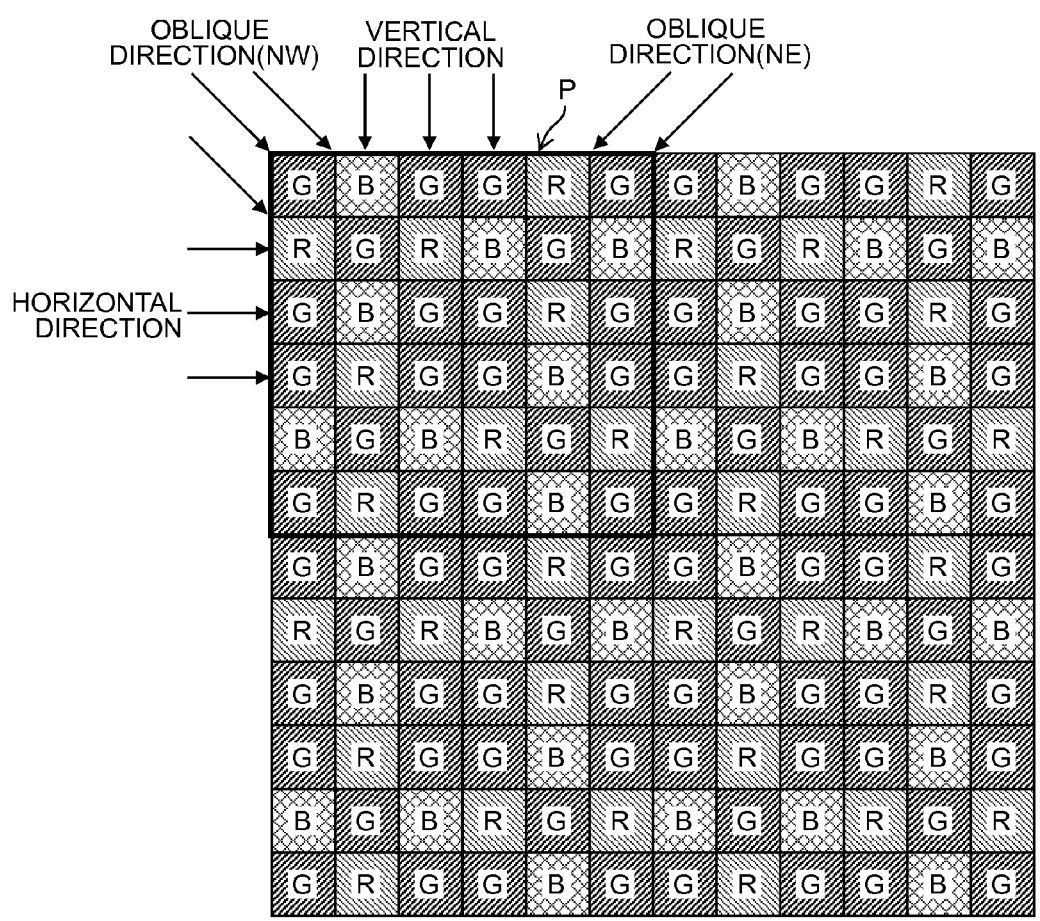
FIG. 1 is a diagram showing a first embodiment of a color imaging element.

FIG. 1 is a diagram showing a first embodiment of a color imaging element. FIG. 1 particularly shows a color filter array of color filters arranged on the color imaging element.

The color imaging element includes: a plurality of pixels (not shown) formed by photoelectric conversion elements arranged in horizontal and vertical directions (two-dimensional square grid shape); and color filters in a color filter array shown in FIG. 1 arranged on light receiving surfaces of the pixels. One of the color filters of three primary colors of red (R), green (G), and blue (B) is arranged on each pixel.

The color imaging element is not limited to a CCD (Charge Coupled Device) color imaging element and may be another type of imaging element such as a CMOS (Complementary Metal Oxide Semiconductor) imaging element.

Features of Color Filter Array

The color filter array of the color imaging element of the first embodiment has the following features (1), (2), (3), (4), (5) and (6).

Feature (1)

The color filter array shown in FIG. 1 includes a basic array pattern P (pattern indicated by a thick frame) formed by a square array pattern corresponding to 6×6 pixels, and the basic array pattern P is repeatedly arranged in the horizontal and vertical directions. Therefore, the color filter array includes filters of respective R, G, and B colors (R filters, G filters, and B filters) arranged in a particular cycle.

In this way, the R filters, the G filters, and the B filters are arranged in a particular cycle. Therefore, demosaicing processing and the like of R, G, and B signals read out from the color imaging element can be processed according to the repeated pattern.

When a thinning-out process is executed based on the basic array pattern P to reduce the image, the color filter array of the reduced image after the thinning-out process can be the same as the color filter array before the thinning-out process. Therefore, a common processing circuit can be used.

Feature (2)

In the color filter array shown in FIG. 1, the G filters corresponding to the color (color of G in the embodiment) that most contributes to obtaining luminance signals are arranged in each line in the horizontal, vertical, upper right (NE), and upper left (NW) directions of the color filter array.

Reference character NE designates an upper right direction, and reference character NW designates a lower right direction. For example, in a case of an array of square pixels, the upper right and lower right directions are directions of 45° from the horizontal direction. In a case of an array of rectangular pixels, the upper right and lower right directions are directions of the diagonal lines of the rectangle, and the angles may vary depending on the lengths of the long side and the short side. The G filters corresponding to the luminance pixels are arranged in each line in the horizontal, vertical, and oblique (NE, NW) directions of the color filter array. Therefore, the reproduction accuracy of the demosaicing processing in a high frequency area can be improved regardless of the direction of the high frequency wave.

Feature (3)

In the basic array pattern of the color filter array shown in FIG. 1, the numbers of pixels of the R pixels, the G pixels, and the B pixels corresponding to the R, G, and B filters in the basic array pattern are eight pixels, twenty pixels, and eight pixels, respectively. Therefore, the ratio of the numbers of pixels of the RGB pixels is 2:5:2, and the proportion of the number of G pixels that most contribute to obtaining the luminance signals is greater than the respective proportions of the numbers of R and B pixels of other colors.

The proportion of the number of G pixels and the proportions of the numbers of R and B pixels are different, and particularly, the proportion of the number of G pixels that most contribute to obtaining the luminance signals is greater than the proportions of the numbers of R and B pixels. Therefore, aliasing in the demosaicing processing can be suppressed, and high frequency reproducibility can be improved.

Feature (4)

In the color filter array shown in FIG. 1, one or more R and B filters corresponding to two or more colors other than the color of G (colors of R and B in the embodiment) are arranged in each line in the horizontal and vertical directions of the color filter array in the basic array pattern P.

The R and B filters are arranged in each line in the horizontal and vertical directions of the color filter array. Therefore, the generation of color moire (false color) can be reduced. As a result, an optical low-pass filter for suppressing (controlling) the generation of false color can be eliminated. Even if the optical low-pass filter is applied, a filter with less effect of cutting high frequency components for preventing the generation of false color can be applied, and a loss of resolution can be prevented.

Figure 2:
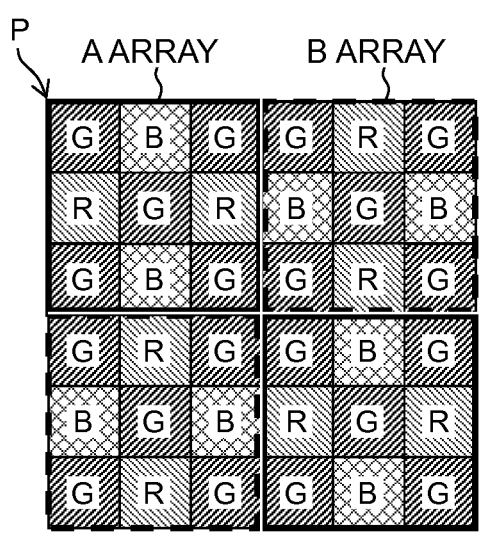
FIG. 2 is a diagram showing a basic array pattern included in a color filter array of the color imaging element according to the first embodiment.

FIG. 2 shows a state in which the basic array pattern P shown in FIG. 1 is divided into four sets of 3×3 pixels.

As shown in FIG. 2, the basic array pattern P can be perceived as a pattern including A arrays (square arrays) of 3×3 pixels surrounded by a frame of solid lines and B arrays (square arrays) of 3×3 pixels surrounded by a frame of broken lines alternately arranged in the horizontal and vertical directions.

Each of the A and B arrays includes G filters as luminance pixels arranged at four corners and a center, and the G filters are arranged on both diagonals. In the A array, the R filters are arranged in the horizontal direction, and the B filters are arranged in the vertical direction, across the G filter at the center. Meanwhile, in the B array, the B filters are arranged in the horizontal direction, and the R filters are arranged in the vertical direction, across the G filter at the center. Therefore, although the positional relationship between the R and B filters is opposite in the A and B arrays, the rest of the arrangement is the same.

Figure 3:
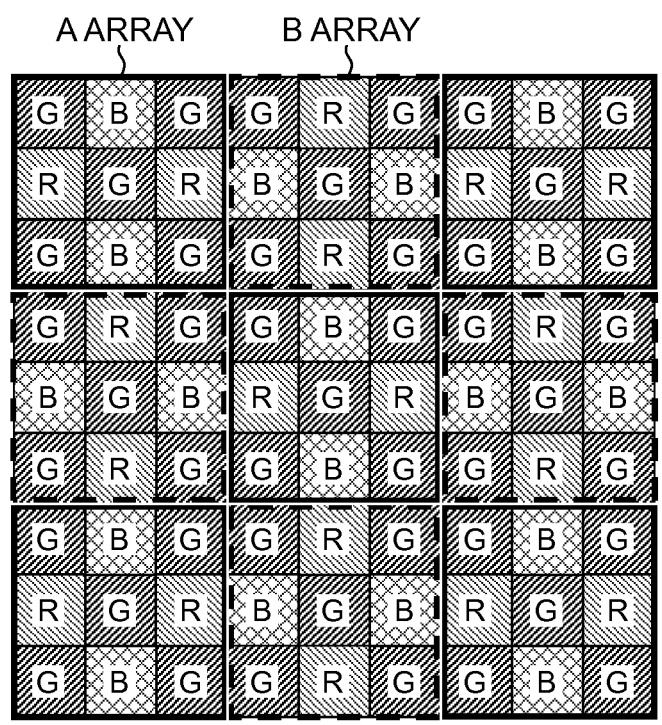
FIG. 3 is a diagram showing a state in which a basic array pattern of 6×6 pixels included in a color filter array of the color imaging element of the first embodiment is divided into A arrays and B arrays of 3×3 pixels, and the A arrays and the B arrays are arranged.

The A and B arrays are alternately arranged in the horizontal and vertical directions as shown in FIG. 3, and the G filters at four corners of the A and B arrays form G filters of square arrays corresponding to 2×2 pixels.

The G filters as luminance pixels are arranged at the four corners and the center in 3×3 pixels in the A and B arrays, and the 3×3 pixels are alternately arranged in the horizontal and vertical directions to form the G filters in the square arrays corresponding to 2×2 pixels. The arrays satisfy the features (1), (2), and (3), as well as a feature (5) described below.

Feature (5)

The color filter array shown in FIG. 1 includes square arrays corresponding to 2×2 pixels of G filters.

Figure 4:
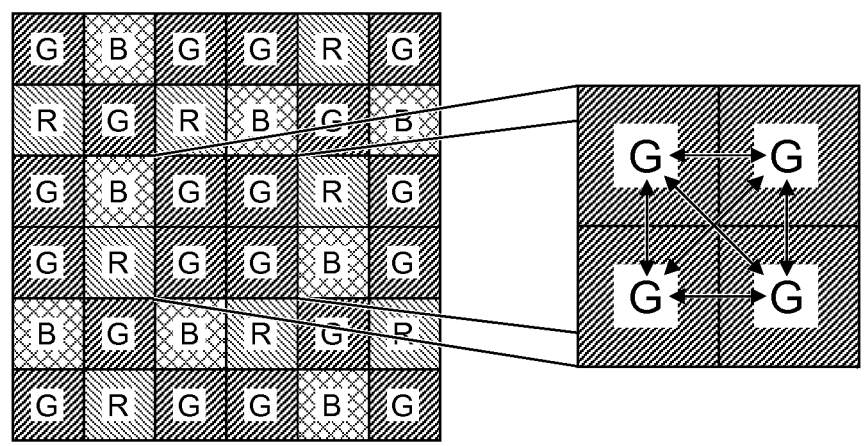
FIG. 4 is a diagram used to explain a method of determining a correlation direction from pixel values of G pixels of 2×2 pixels included in the color filter array of the color imaging element of the first embodiment.

As shown in FIG. 4, 2×2 pixels of G filters are extracted to calculate difference absolute values of the pixel values of the G pixels in the horizontal direction, difference absolute values of the pixel values of the G pixels in the vertical direction, and difference absolute values of the pixel values of the G pixels in the oblique (NE, NW) directions. In this way, it can be determined that there is a correlation in the direction with a small difference absolute value among the horizontal, vertical, and oblique (NE, NW) directions.

Therefore, according to the color filter array, information of the G pixels at minimum pixel intervals can be used to determine the direction with a high correlation among the horizontal, vertical, and oblique (NE, NW) directions. The direction determination result can be used for a process of interpolation (demosaicing processing) based on surrounding pixels.

Figure 5:
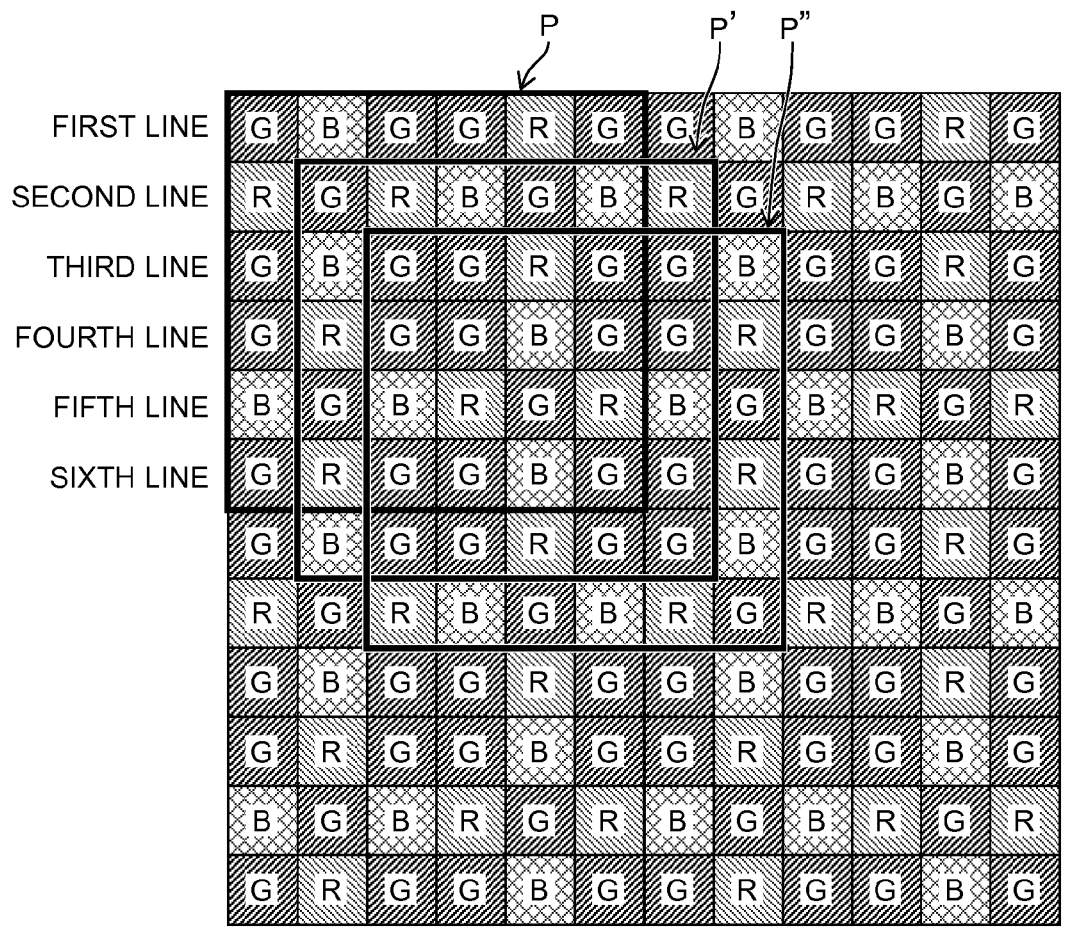
FIG. 5 is a diagram used to explain a concept of the basic array pattern included in the color filter array of the color imaging element.

When the pixels of the A or B array of 3×3 pixels are the target pixels of the demosaicing processing as shown in FIG. 3, and 5×5 pixels (local area of mosaic image) are extracted around the A or B array, there are G pixels of 2×2 pixels at four corners of the 5×5 pixels. The pixel values of the G pixels of 2×2 pixels can be used to accurately determine the correlation direction of four directions using the information of the G pixels at minimum pixel intervals.

Feature (6)

The basic array pattern of the color filter array shown in FIG. 1 is point-symmetric with respect to the center of the basic array pattern (center of four G pixels). As shown in FIG. 2, the A and B arrays in the basic array pattern are also point-symmetric with respect to the G filter at the center.

The symmetry can reduce and simplify the circuit size of a processing circuit in a later stage.

In the basic array pattern P shown by a thick frame as shown in FIG. 5, color filter arrays of first and third lines among first to sixth lines in the horizontal direction include GBGGRG, a color filter array of the second line includes RGRBGB, color filter arrays of the fourth and sixth lines include GRGGBG, and a color filter array of the fifth line includes BGBRGR.

In FIG. 5, assuming that a basic array pattern obtained by shifting the basic array pattern P by one pixel both in the horizontal and vertical directions is P' and a basic array pattern obtained by shifting the basic array pattern P by two pixels both in the horizontal and vertical directions is P''', the color filter array is the same even if the basic array patterns P' and P''' are repeatedly arranged in the horizontal and vertical directions.

Therefore, there are a plurality of basic array patterns that can form the color filter array shown in FIG. 5 by repeatedly arranging the basic array pattern in the horizontal and vertical directions. In the first embodiment, the basic array pattern P in which the basic array pattern is point-symmetric is called a basic array pattern for convenience.

Although there are also a plurality of basic array patterns for each of the color filter arrays in the other embodiments described below, the representative one will be called a basic array pattern of the color filter array.

Second Embodiment of Color Imaging Element

Figure 6:
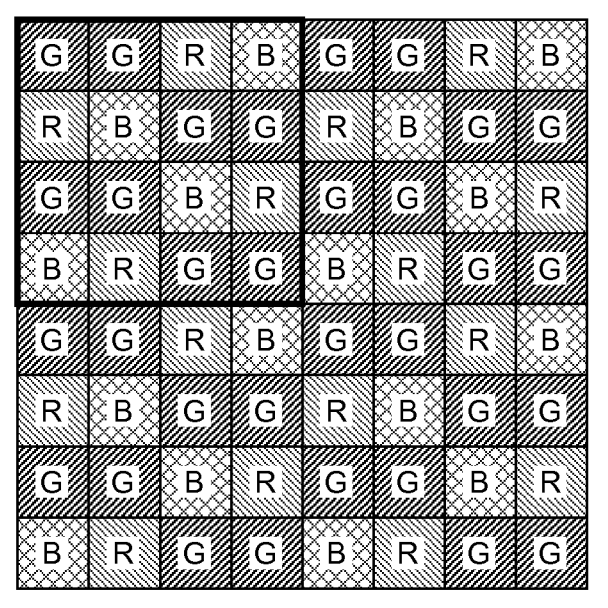

FIG. 6 is a diagram showing a second embodiment of the color imaging element. FIG. 6 particularly shows a color filter array of color filters arranged on the color imaging element.

The color filter array of the color imaging element of the second embodiment includes a basic array pattern (pattern shown by a thick frame) formed by a square array pattern corresponding to 4×4 pixels. The basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

The basic array pattern is point-symmetric with respect to the center of the basic array pattern. Meanwhile, the color filter array does not include a square array corresponding to 2×2 pixels of G filters. However, the color filter array includes G filters adjacent to each other in the horizontal direction and G filters adjacent to each other in the oblique (NE, NW) directions.

In the vertical direction, there are G filters across the R or B filter. Therefore, the pixel values of the G pixels corresponding to the G filters can be used to determine the correlation in the vertical direction.

In the basic array pattern of the color filter array shown in FIG. 6, the numbers of pixels of the R pixels, the G pixels, and the B pixels corresponding to the R, G, and B filters in the basic array pattern are four pixels, eight pixels, and four pixels, respectively. Therefore, the ratio of the numbers of RGB pixels is 1:2:1, and the proportion of the number of G pixels that most contribute to obtaining the luminance signals is greater than the respective proportions of the numbers of R and B pixels of other colors.

As described, the color filter array of the color imaging element of the second embodiment has the same features as the features (1), (2), (3), (4), and (6) of the color filter array of the color imaging element of the first embodiment.

Third Embodiment of Color Imaging Element

Figure 7:
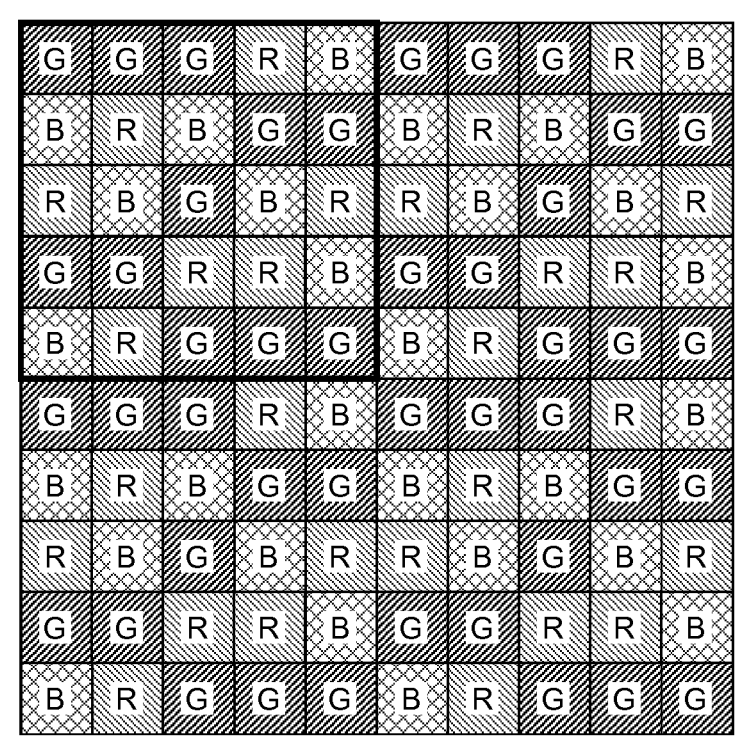

FIG. 7 is a diagram showing a third embodiment of the color imaging element. FIG. 7 particularly shows a color filter array of color filters arranged on the color imaging element.

The color filter array of the color imaging element of the third embodiment includes a basic array pattern (pattern shown by a thick frame) formed by a square array pattern corresponding to 5×5 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R filters and B filters arranged in each line in the horizontal and vertical directions of the color filter array.

In the basic array pattern of the color filter array shown in FIG. 7, the numbers of pixels of the R pixels, the G pixels, and the B pixels corresponding to the R, G, and B filters in the basic array pattern are seven pixels, eleven pixels, and seven pixels, respectively. Therefore, the ratio of the numbers of RGB pixels is 7:11:7, and the proportion of the number of G pixels that most contribute to obtaining the luminance signals is greater than the respective proportions of the numbers of R and B pixels of other colors.

The basic array pattern is not point-symmetric, and the basic array pattern does not include a square array corresponding to 2×2 pixels formed by G filters.

The color filter array of the color imaging element of the third embodiment has the same features as the features (1), (2), (3), and (4) of the color filter array of the color imaging element of the first embodiment.

Fourth Embodiment of Color Imaging Element

Figure 8:
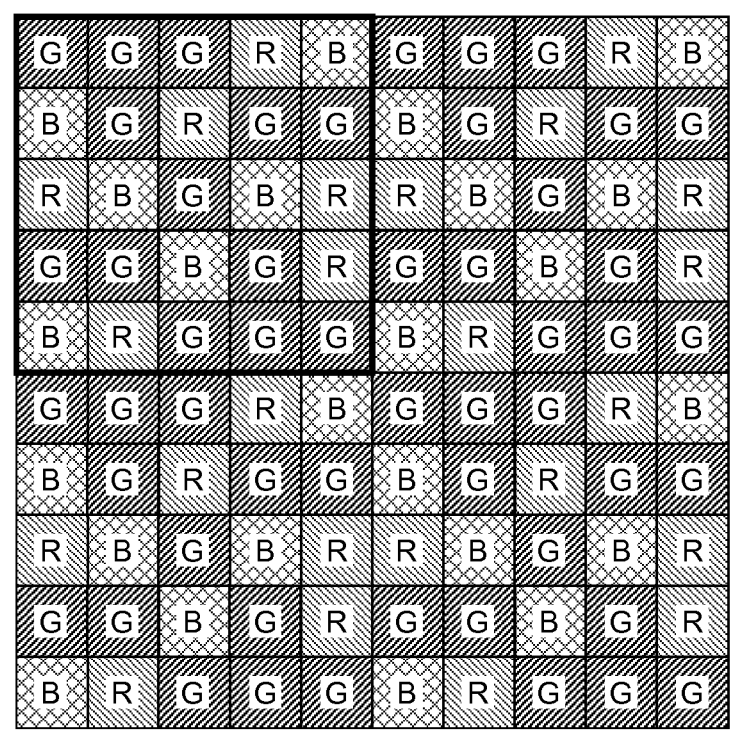

FIG. 8 is a diagram showing a fourth embodiment of the color imaging element. FIG. 8 particularly shows a color filter array of color filters arranged on the color imaging element.

As in the third embodiment, the color filter array of the color imaging element of the fourth embodiment includes a basic array pattern (pattern shown by a thick frame) formed by a square array pattern corresponding to 5×5 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

In the basic array pattern of the color filter array shown in FIG. 8, the numbers of pixels of the R pixels, the G pixels, and the B pixels corresponding to the R, G, and B filters in the basic array pattern are six pixels, thirteen pixels, and six pixels, respectively. Therefore, the ratio of the numbers of RGB pixels is 6:13:6, and the proportion of the number of G pixels that most contribute to obtaining the luminance signals is greater than the respective proportions of the numbers of R and B pixels of other colors.

Although the color filter array does not include a square array corresponding to 2×2 pixels of G filters, the color filter array includes a set of four pixels with G filters adjacent to each other. The correlation in the horizontal, vertical, and oblique (NE, NW) directions can be determined at minimum pixel intervals based on the pixels values of the four pixels. The basic array pattern is not point-symmetric.

The color filter array of the color imaging element of the fourth embodiment has the same features as the features (1), (2), (3), (4), and (5) of the color filter array of the color imaging element of the first embodiment.

Fifth Embodiment of Color Imaging Element

Figure 9:
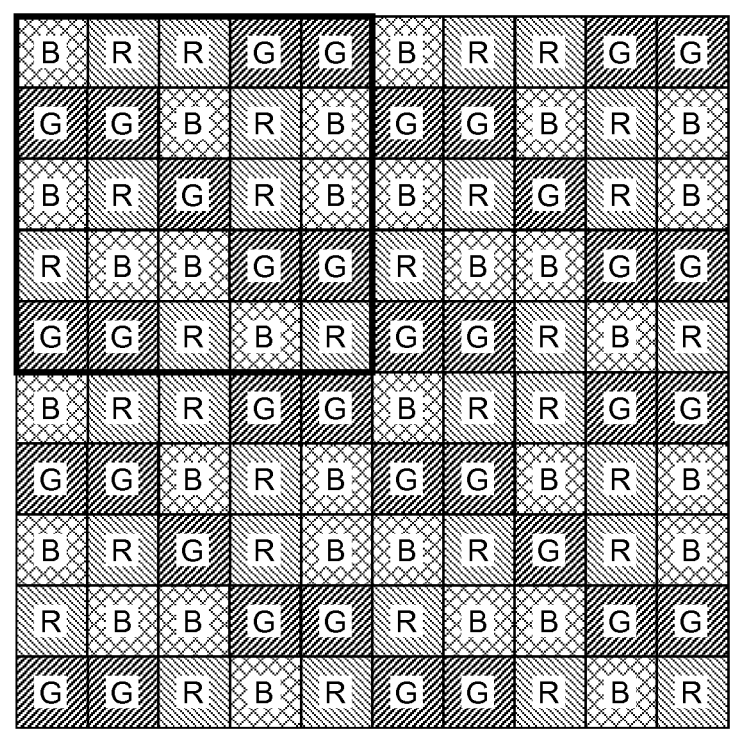

FIG. 9 is a diagram showing a fifth embodiment of the color imaging element. FIG. 9 particularly shows a color filter array of color filters arranged on the color imaging element.

As in the third embodiment, the color filter array of the color imaging element of the fifth embodiment includes a basic array pattern (pattern shown by a thick frame) formed by a square array pattern corresponding to 5×5 pixels, and the basic array pattern is repeatedly arranged in the horizontal and vertical directions.

The color filter array includes G filters arranged in each line in the horizontal, vertical, and oblique (NE, NW) directions of the color filter array and includes R and B filters arranged in each line in the horizontal, vertical, and oblique (NE, NW) directions of the color filter array.

Therefore, the color filter array includes all R, G, and B filters arranged in each line in the horizontal, vertical, and oblique (NE, NW) directions of the color filter array. As a result, the color reproducibility in the oblique directions can be further improved, and this is a feature not included in the color filter array of the color imaging element of the first embodiment.

In the basic array pattern of the color filter array shown in FIG. 9, the numbers of pixels of the R pixels, the G pixels, and the B pixels corresponding to the R, G, and B filters in the basic array pattern are eight pixels, nine pixels, and eight pixels, respectively. Therefore, the ratio of the numbers of RGB pixels is 8:9:8, and the proportion of the number of G pixels that most contribute to obtaining the luminance signals is greater than the respective proportions of the numbers of R and B pixels of other colors.

Meanwhile, the color filter array does not include a square array corresponding to 2×2 pixels of G filters, and the basic array pattern is not point-symmetric.

The color filter array of the color imaging element of the fifth embodiment has the same features as the features (1), (2), (3), and (4) of the color filter array of the color imaging element of the first embodiment.

Sixth Embodiment of Color Imaging Element

Figure 10:
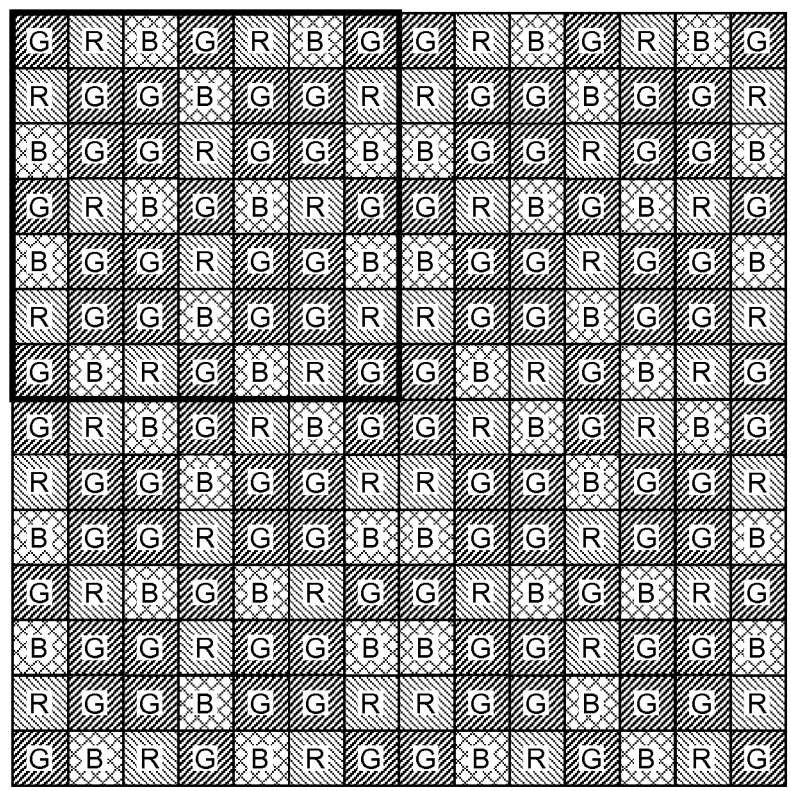
FIG. 10 is a diagram showing a sixth embodiment of the color imaging element.

FIG. 10 is a diagram showing a sixth embodiment of the color imaging element. FIG. 10 particularly shows a color filter array of color filters arranged on the color imaging element.

The color filter array of the color imaging element of the sixth embodiment includes a basic array pattern (pattern shown by a thick frame) formed by a square array pattern corresponding to 7×7 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

In the basic array pattern of the color filter array shown in FIG. 10, the numbers of pixels of the R pixels, the G pixels, and the B pixels corresponding to the R, G, and B filters in the basic array pattern are twelve pixels, twenty five pixels, and twelve pixels, respectively. Therefore, the ratio of the numbers of RGB pixels is 12:25:12, and the proportion of the number of G pixels that most contribute to obtaining the luminance signals is greater than the respective proportions of the numbers of R and B pixels of other colors.

The color filter array includes a square array corresponding to 2×2 pixels of G filters, and the basic array pattern is point-symmetric with respect to the center of the basic array pattern.

The color filter array of the color imaging element of the sixth embodiment has the same features as the features (1), (2), (3), (4), (5), and (6) of the color filter array of the color imaging element of the first embodiment.

Seventh Embodiment of Color Imaging Element

Figure 11:
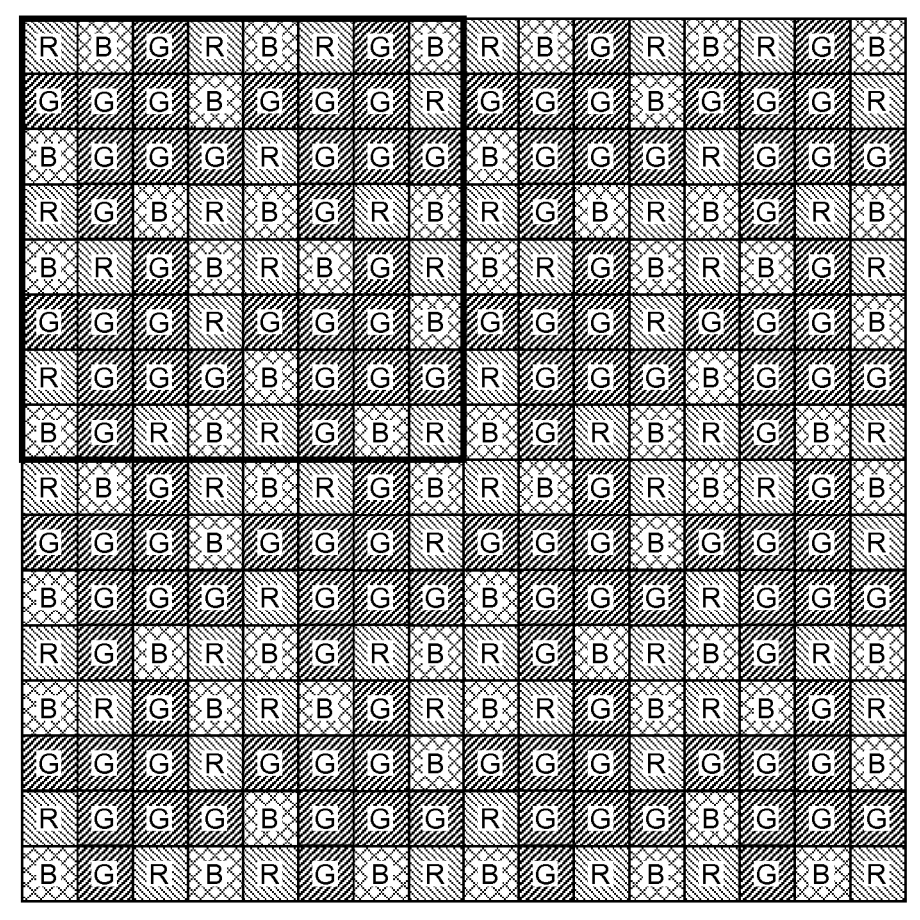

FIG. 11 is a diagram showing a seventh embodiment of the color imaging element. FIG. 11 particularly shows a color filter array of color filters arranged on the color imaging element.

The color filter array of the color imaging element of the seventh embodiment includes a basic array pattern (pattern shown by a thick frame) formed by a square array pattern corresponding to 8×8 pixels, and the basic array pattern is repeatedly arranged in the horizontal and vertical directions.

As in the first embodiment, the color filter array includes G filters arranged in each line in the horizontal, vertical, and oblique (NE, NW) directions of the color filter array and includes R and B filters arranged in each line in the horizontal and vertical directions of the color filter array.

In the basic array pattern of the color filter array shown in FIG. 11, the numbers of pixels of the R pixels, the G pixels, and the B pixels corresponding to the R, G, and B filters in the basic array pattern are sixteen pixels, thirty two pixels, and sixteen pixels, respectively. Therefore, the ratio of the numbers of RGB pixels is 1:2:1, and the proportion of the number of G pixels that most contribute to obtaining the luminance pixels is greater than the respective proportions of the numbers of R and B pixels of other colors.

The color filter array includes a square array corresponding to 2×2 pixels of G filters, and the basic array pattern is point-symmetric with respect to the center of the basic array pattern.

When the basic array pattern is divided into four sets of 4×4 pixels, the diagonal arrays of 4×4 pixels are the same, and the positional relationship of the R and B filters is opposite in the arrays of 4×4 pixels adjacent to each other in the horizontal or vertical direction. The rest of the arrangement is the same.

The color filter array of the color imaging element of the seventh embodiment has the same features as the features (1), (2), (3), (4), (5), and (6) of the color filter array of the color imaging element of the first embodiment.

Eighth Embodiment of Color Imaging Element

Figure 12:
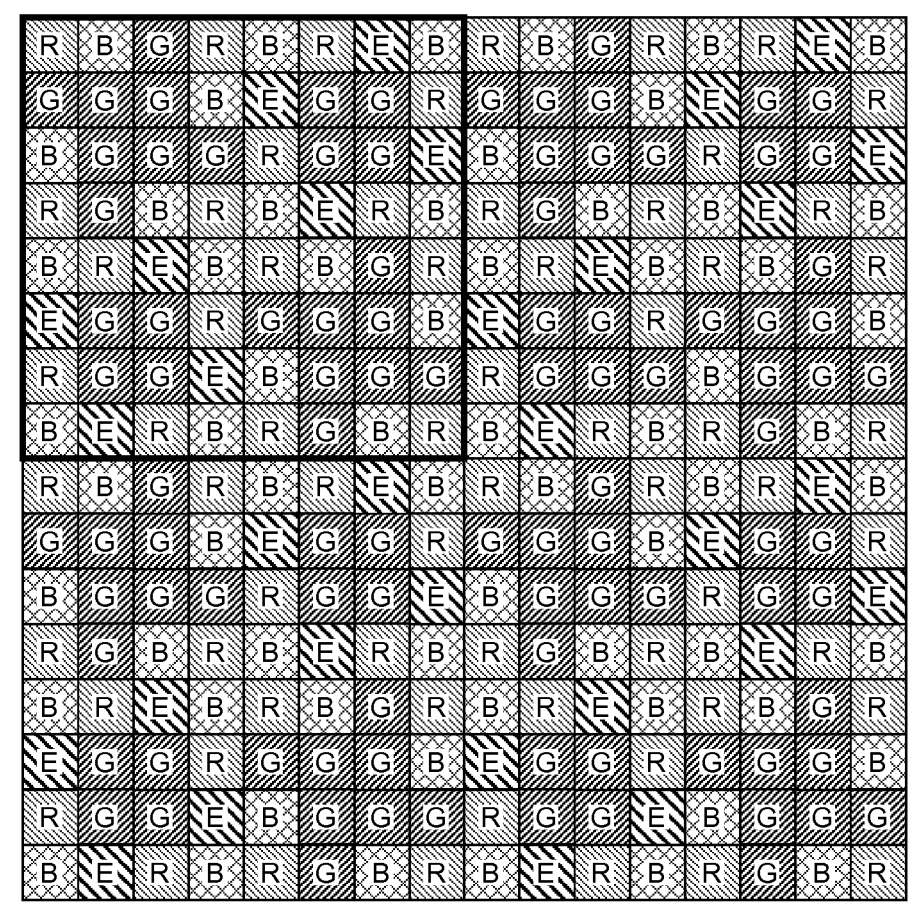

FIG. 12 is a diagram showing an eighth embodiment of the color imaging element. FIG. 12 particularly shows a color filter array of color filters arranged on the color imaging element.

The color filter arrays of the color imaging element of the first to seventh embodiments are color filter arrays of color filters of three primary colors of RGB. The color filter array of the color imaging element of the eighth embodiment is different in that the array is a color filter array of four color filters including E filters of emerald (E) in addition to the RGB filters.

The color filter array of the color imaging element of the eighth embodiment includes a basic array pattern (pattern shown by a thick frame) formed by a square array pattern corresponding to 8×8 pixels as in the seventh embodiment, and the basic array pattern is repeatedly arranged in the horizontal and vertical directions.

The color filter array includes G filters arranged in each line in the horizontal, vertical, and oblique (NE, NW) directions of the color filter array and includes R filters, B filters, and E filters arranged in each line in the horizontal and vertical directions of the color filter array.

In the basic array pattern of the color filter array shown in FIG. 12, the numbers of pixels of the R pixels, the G pixels, the B pixels, and the E pixels corresponding to the R, G, B, and E filters in the basic array pattern are sixteen pixels, twenty four pixels, sixteen pixels, and eight pixels, respectively. Therefore, the ratio of the numbers of RGBE pixels is 2:3:2:1, and the proportion of the number of G pixels that most contribute to obtaining the luminance signals is greater than the respective proportions of the numbers of R pixels, B pixels, and E pixels of other colors.

The color filter array includes a square array corresponding to 2×2 pixels of G filters, and the basic array pattern is point-symmetric with respect to the center of the basic array pattern.

The color filter array of the color imaging element of the eighth embodiment has the same features as the features (1), (2), (3), (4), (5), and (6) of the color filter array of the color imaging element of the first embodiment.

Ninth Embodiment of Color Imaging Element

Figure 13:
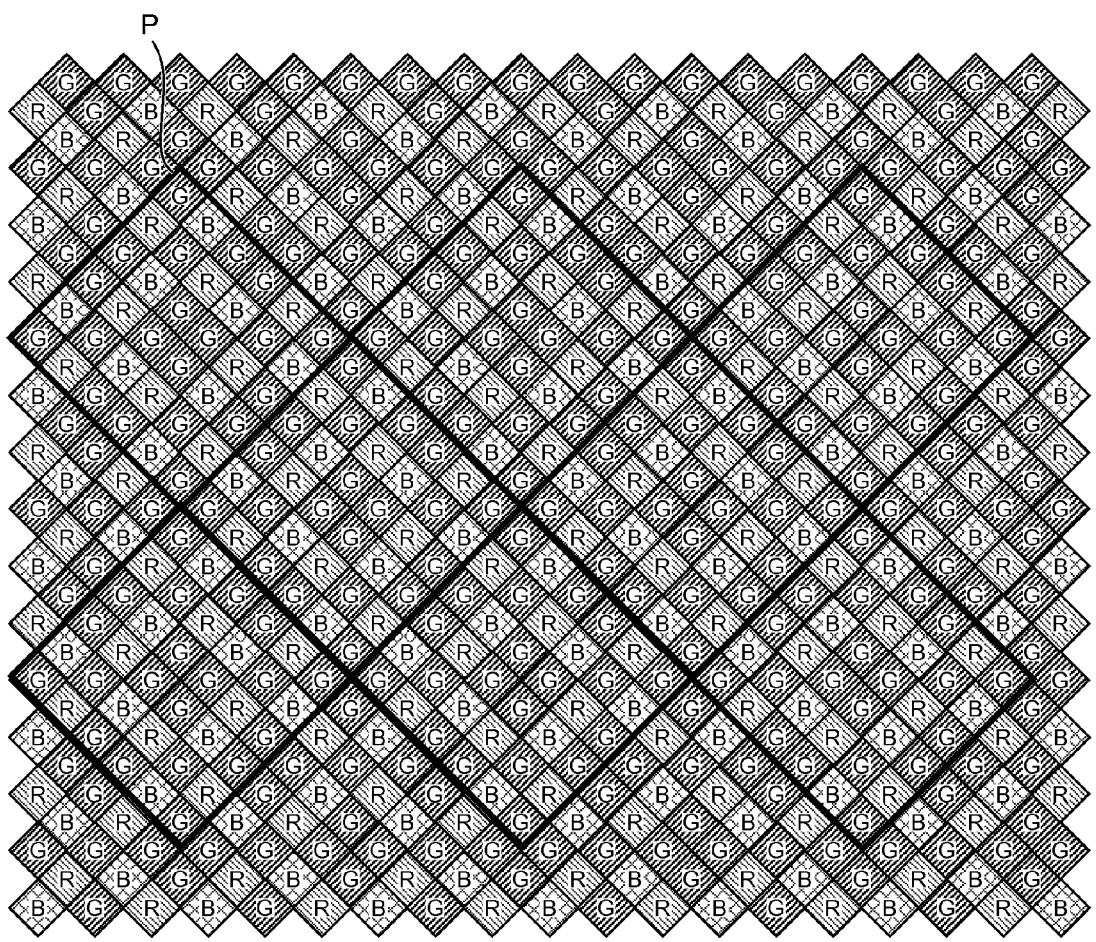
FIG. 13 is a diagram showing a ninth embodiment of the color imaging element.

FIG. 13 is a diagram showing a ninth embodiment of the color imaging element, and FIG. 13 particularly illustrates a color filter array of color filters arranged on the color imaging element.

The color filter arrays of the color imaging element according to the first to eighth embodiments are applied to the imaging element including a plurality pixels arranged in a square grid shape. The color filter array of the color imaging element according to the ninth embodiment is different in that the color filter array is applied to an imaging element including a plurality of pixels arranged in a diagonal grid shape.

More specifically, a plurality of two-dimensionally arranged pixels of the color imaging element shown in FIG. 13 are arranged in a diagonal grid shape. As a result, adjacent pixels on horizontal lines are shifted at a ½ pitch in each line.

The color filter array of the color imaging element shown in FIG. 13 includes a basic array pattern P (pattern shown by a thick frame) formed by a diagonal grid array pattern corresponding to 6×6 pixels, and the basic array pattern P is repeatedly arranged in a diagonal grid shape. More specifically, the color filter array includes filters of respective R, G, and B colors (R filters, G filters, and B filters) arranged in a specific cycle.

Figure 14:
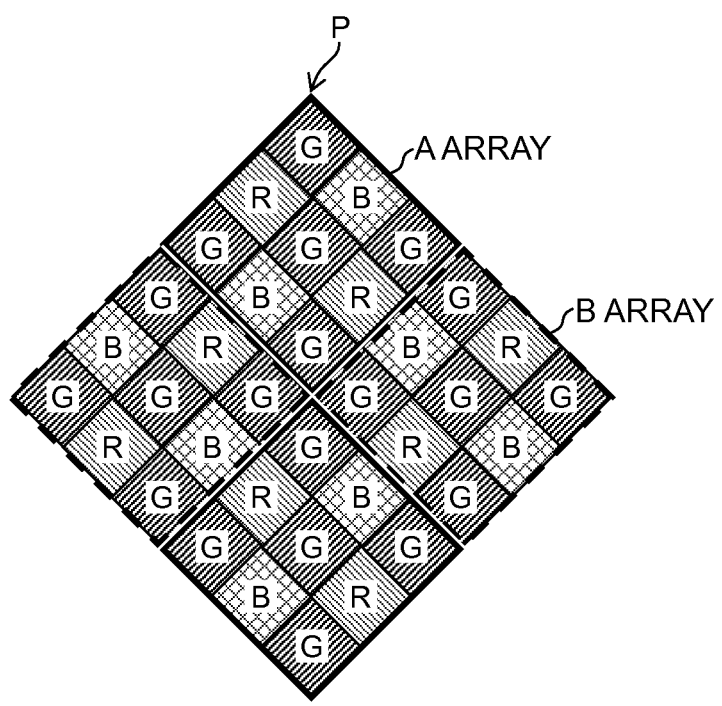
FIG. 14 is a diagram showing a basic array pattern included in a color filter array of the color imaging element according to the ninth embodiment.

FIG. 14 is a diagram showing a basic array pattern included in the color filter array shown in FIG. 9.

The color filter array of the color imaging element according to the ninth embodiment shown in FIG. 14 corresponds to the color filter array of the color imaging element according to the first embodiment shown in FIG. 2 rotated by 45°.

Therefore, the color filter array of the ninth embodiment is the same as the color filter array of the first embodiment in that the G filters corresponding to the color (color of G in this embodiment) that most contributes to obtaining the luminance signals are arranged in each line in the horizontal, vertical, and oblique (NE, NW) directions of the color filter array.

The G filters corresponding to the luminance pixels are arranged in each line in the horizontal, vertical, and oblique (NE, NW) directions of the color filter array. Therefore, the reproduction accuracy of the demosaicing process in a high frequency area can be improved regardless of the direction of the high frequency wave.

As shown in FIG. 14, the color filter array of the ninth embodiment corresponds to the color filter array of the color imaging element of the first embodiment shown in FIG. 2 rotated by 45°. Therefore, the numbers of pixels of the R pixels, the G pixels, and the B pixels corresponding to the R, G, and B filters in the basic array pattern are 8 pixels, 20 pixels, and 8 pixels, respectively, as in the basic array pattern of the first embodiment. Therefore, the ratio of the numbers of RGB pixels is 2:5:2, and the proportion of the number of G pixels that most contribute to obtaining the luminance signals is greater than the proportions of the numbers of R and B pixels of other colors.

On the other hand, the color filter array of the first embodiment shown in FIG. 1 includes one or more R filters and B filters arranged in each line in the horizontal and vertical directions of the color filter array in the basic array pattern P. Since the color filter array of the ninth embodiment corresponds to the color filter array of the first embodiment rotated by 45° as shown in FIG. 14, one or more R filters and B filters are arranged in each line in the oblique (NE, NW) directions of the color filter array in the basic array pattern.

In this way, the R and B filters are arranged in each line in the oblique (NE, NW) directions of the color filter array. Therefore, the generation of color moire (false color) can be reduced. As a result, an optical low-pass filter for suppressing the generation of false color can be eliminated. Even if the optical low-pass filter is applied, a filter with less effect of cutting high frequency components for preventing the generation of false color can be applied, and a loss of resolution can be prevented.

As shown in FIG. 14, the basic array pattern P can be perceived as a pattern including the A arrays (diagonal grid arrays) of 3×3 pixels and the B arrays (diagonal grid arrays) of 3×3 pixels arranged alternately.

Each of the A and B arrays includes G filters as luminance pixels arranged at four corners and a center, and the G filters are arranged on both diagonals of the 3×3 pixels. In the A array, the R filters are arranged in the lower right direction, and the B filters are arranged in the upper right direction, across the G filter at the center. Meanwhile, in the B array, the B filters are arranged in the lower right direction, and the R filters are arranged in the upper right direction, across the G filter at the center. Therefore, although the positional relationship between the R and B filters is opposite in the A and B arrays, the rest of the arrangement is the same.

The A and B arrays are alternately arranged in the diagonal grid shape, and the G filters at four corners of the A and B arrays form G filters in a diagonal grid array corresponding to 2×2 pixels (array in a cross shape with vertically and horizontally adjacent four pixels).

This is because the G filters as luminance pixels are arranged at the four corners and the center in 3×3 pixels in the A or B array, and the 3×3 pixels are arranged in the diagonal grid shape to form the G filters in the diagonal grid array corresponding to 2×2 pixels.

Furthermore, the basic array pattern of the color filter array shown in FIG. 14 is point-symmetric with respect to the center of the basic array pattern (center of four G filters). The A and B arrays in the basic array pattern are also point-symmetric with respect to the G filters at the center.

The symmetry can reduce and simplify the circuit size of the processing circuit in the later stage.

In this way, the color filter array of the color imaging element of the ninth embodiment corresponds to the color filter array of the color filters arranged on the color imaging element of the first embodiment rotated by 45°. Therefore, although the color filter array is different from the first embodiment in that the R and B filters are arranged in each line in the oblique (NE, NW) directions of the basic color filter array, the color filter array has the same features as the features (1), (2), (3), (4), (5), and (6) of the color filter array of the color imaging element of the first embodiment.

In an imaging element including a plurality of pixels arranged in a diagonal grid shape, the reproducible band in the horizontal and vertical directions is $\sqrt{2}$ times that of an imaging element arranged in a square grid shape. The characteristics match with the frequency characteristics of human vision that are higher in the horizontal and vertical directions than in the oblique directions, and this structure is visually advantageous.

Modified Example of Ninth Embodiment

The color imaging element is not limited to the color imaging element of the ninth embodiment, and the color imaging element may include a plurality of pixels arranged in a diagonal grid shape and may include the color filter array of one of the second to eighth embodiments shown in FIGS. 6 to 12 rotated by 45° arranged on the pixels lined up in the diagonal grid shape.

The color imaging elements in this case has the same features as the color imaging elements of the second to eighth embodiments.

Tenth Embodiment of Color Imaging Element (A) portion of FIG. 15 is a diagram showing a tenth embodiment of the color imaging element, and (A) portion of FIG. 15 particularly illustrates a color filter array of color filters arranged on the color imaging element.

The color imaging element of the tenth embodiment includes a plurality of pixels arranged in a square grid shape. When the pixels are sorted into a first pixel group and a second pixel group arranged in checked grid shapes as shown in (B) and (C) portions of FIG. 15, color filters of the same color filter array are arranged for the first and second pixel groups.

More specifically, when a plurality of pixels arranged in a square grid shape correspond to pixels at positions of white or black of a checkered flag, the first and second pixel groups shown in (B) and (C) portions of FIG. 15 are pixel groups corresponding to the positions of white or black of the checkered flag, and the pixel groups are arranged in diagonal grid shapes.

The color filter array arranged on the first and second pixel groups shown in (B) and (C) portions of FIG. 15 is the same array as the color filter array of the ninth embodiment illustrated in FIG. 13. The color filter array includes the basic array pattern P (pattern indicated by a thick frame) formed by a diagonal grid array pattern corresponding to 6×6 pixels, and the basic array pattern P is repeatedly arranged in the diagonal grid shape.

The color filter array shown in (B) portion of FIG. 15 and the color filter array shown in (C) portion of FIG. 15 are shifted in the vertical direction at one pixel pitch of the pixels arranged in the square grid shape shown in (A) portion of FIG. 15.

According to the color imaging element of the tenth embodiment, an image corresponding to the first pixel group (hereinafter, called "A plane") shown in (B) portion of FIG. 15 and an image corresponding to the second pixel group (hereinafter, called "B plane") shown in (C) portion of FIG. 15 can be acquired at the same time.

In this case, a mosaic image of the A plane and a mosaic image of the B plane have the same configuration as a mosaic image acquired from the color imaging element of the ninth embodiment, and the color imaging element of the tenth embodiment has the same features as the color imaging element of the ninth embodiment.

The color imaging element of the tenth embodiment can independently control the exposure (electric charge accumulation time) of the A and B planes to obtain images with different sensitivity between the A and B planes and can combine the images to generate a wide dynamic range image. The A and B planes can be set to the same electric charge accumulation time (shutter speed), and images of the A and B planes can be added to acquire a low-noise image. A high-resolution image can also be acquired without adding the pixels.

Although the color filter array of the A plane and the color filter array of the B plane are shifted at one pixel pitch in the vertical direction in the color imaging element of the tenth embodiment shown in FIG. 15, the arrangement is not limited to this, and the color filter arrays may be shifted at one pixel pitch in the horizontal direction. The color filter array in this case corresponds to the color filter array shown in (A) portion of FIG. 15 rotated by 90 degrees.

Modified Example of Tenth Embodiment

The color imaging element is not limited to the color imaging element of the tenth embodiment, and the color imaging element may include a plurality of pixels arranged in a square grid shape and may include the color filter array of one of the second to eighth embodiments shown in FIGS. 6 to 12 rotated by 45°, shifted in the horizontal or vertical direction, and arranged on the pixels of the A or B plane as in the tenth embodiment.

The color imaging elements in this case has the same features as the color imaging elements of the second to eighth embodiments, and two images of the A and B planes can be acquired at the same time.

Others

Although the color filter arrays with color filters of three primary colors of RGB and the color filter array with color filters of four colors including three primary colors of RGB and another color (for example, emerald (E)) have been described in the embodiments, the types of the color filters are not limited to the embodiments.

Modified Example

Although the example of adopting green (G) as a first color and adopting red (R) and blue (B) as second colors has been described in the embodiments, the colors that can be used in the color filters are not limited to these colors, and color filters corresponding to colors satisfying the following conditions can also be used.

Conditions of First Filter (First Color)

Although the example that the G filters of G color serve as the first filters in the first color of the present invention has been described in the embodiments, filters satisfying one of the following conditions (1) to (4) may be used in place of the G filters or in place of part of the G filters.

Condition (1)

The condition (1) is that the contribution ratio for obtaining the luminance signals is equal to or greater than 50%. The contribution ratio 50% is a value that is set to make a distinction between the first color (such as G color) and the second color (such as R and B colors) of the present invention and is a value that is set so that a color with the contribution ratio for obtaining the luminance data higher than that of the R color, B color, and the like is included in the "first color".

A color with the contribution ratio lower than 50% is a second color (such as R and B colors) of the present invention, and a filter in this color is the second filter of the present invention.

Condition (2)

The condition (2) is that the peak of the transmittance of the filter is in a range of wavelength 480 nm or more and 570 nm or less. A value measured by, for example, a spectrophotometer is used as the transmittance of the filter. The wavelength range is a range that is set to make a distinction between the first color (such as G color) and the second color (such as R and B colors) of the present invention and is a range that is set so that the peak of the R color, the B color, or the like with a relatively low contribution ratio is not included and the peak of the G color or the like with a relatively high contribution ratio is included. Therefore, a filter with the peak of the transmittance in the range of wavelength 480 nm or more and 570 or less can be used as a first filter. A filter with the peak of the transmittance out of the range of wavelength 480 nm or more and 570 or less is a second filter (R filter, B filter) of the present invention.

Condition (3)

The condition (3) is that the transmittance in a range of wavelength 500 nm or more and 560 or less is higher than the transmittance of the second filter (R filter or B filter). A value measured by, for example, a spectrophotometer is also used as the transmittance of the filter in the condition (3). The wavelength range of the condition (3) is also a range that is set to make a distinction between the first color (such as G color) and the second color (such as R and B colors) of the present invention and is a range that the transmittance of the filter in a color with the contribution ratio relatively higher than the R color, the B color, and the like is higher than the transmittance of the RB filters and the like. Therefore, a filter with a relatively high transmittance in the range of wavelength 500 nm or more and 560 nm or less can be used as a first filter, and a filter with a relatively low transmittance can be used as a second filter.

Condition (4)

The condition (4) is that filters of two or more colors including a color that most contributes to the luminance signals among the three primary colors (for example, G color of RGB) and including a color different from the three primary colors are used as first filters. In this case, a filter corresponding to a color other than the colors of the first filters is a second filter.

A Plurality of Types of First Filters (G Filters)

Therefore, the G filters of G color as the first filters are not limited to one type, and for example, a plurality of types of G filters (G1 filters, G2 filters) can be used as the first filters. More specifically, the G filters of the color filters (basic array pattern) according to the embodiments may be appropriately replaced by the G1 filters or the G2 filters. The G1 filters transmit G light of a first wavelength band, and the G2 filters transmit G light of a second wavelength band highly correlated with the G1 filters (see FIG. 16).

Existing G filters (for example, G filters of the first embodiment) can be used as the G1 filters. Filters highly correlated with the G1 filters can be used as the G2 filters. In this case, it is desirable that the peak value of the spectral sensitivity curve of the light receiving elements provided with the G2 filters is, for example, in a range of wavelength 500 nm to 535 nm (near the peak value of the spectral sensitivity curve of the light receiving elements provided with the existing G filters). A method described for example in Japanese Patent Application Laid-Open No. 2003-284084 is used as a method of determining the color filters of four colors (R, G1, G2, B).

In this way, the color imaging element acquires four types of colors in the image, and color information to be acquired is increased. As a result, colors can be more accurately expressed compared to when only three types of colors (RGB) are acquired. More specifically, visually different colors can be reproduced as different colors, and visually same colors can be reproduced as same colors ("color determination" can be improved).

Since the transmittance of the G1 and G2 filters is basically the same as the transmittance of the G filters of the first embodiment, the contribution ratio for obtaining the luminance signals is higher than 50%. Therefore, the G1 and G2 filters satisfy the condition (1).

Figure 16:
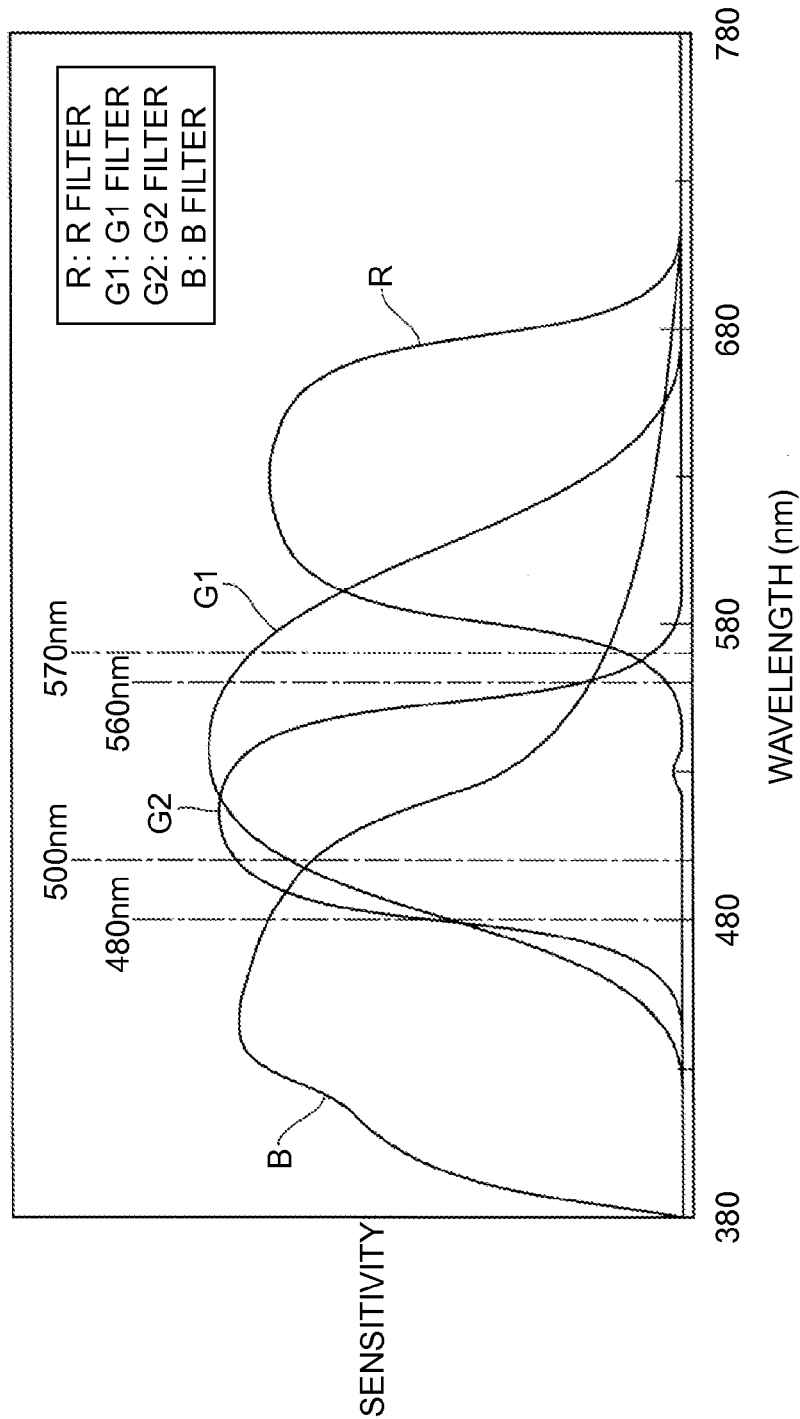
FIG. 16 is a graph showing spectral sensitivity characteristics of a light receiving element provided with R filters (red filters), G1 filters (first green filters), G2 filters (second green filters), and B filters (blue filters).

In FIG. 16 showing the spectral sensitivity characteristics of the color filter array (light receiving elements), the peak of the transmittance of the G1 and G2 filters (peak of the sensitivity of the G pixels) is in the range of wavelength 480 nm or more and 570 nm or less. The transmittance of the G1 and G2 filters is in the range of wavelength 500 nm or more and 560 nm or less and is higher than the transmittance of the RB filters. Therefore, the G1 and G2 filters also satisfy the conditions (2) and (3).

The arrangement and the number of G1 and G2 filters may be appropriately changed. The types of the G filters may be increased to three or more types.

Transparent Filters (W Filters)

Although the embodiments mainly illustrate color filters made of color filters corresponding to RGB colors, part of the color filters may be transparent filters W (white pixels). Particularly, it is preferable to arrange the transparent filters W in place of part of the first filters (G filters). The replacement of part of the G pixels with the white pixels can suppress the degradation in the color reproducibility even if the pixel size is miniaturized.

The transparent filters W are filters of a transparent color (first color). The transparent filters W are filters that can transmit light corresponding to a wavelength band of visible light, and for example, the transmittance of light of the RGB colors is 50% or more. Since the transmittance of the transparent filters W is higher than that of the G filters, the contribution ratio for obtaining the luminance signals is also higher than that of the G color (60%), and the condition (1) is satisfied.

Figure 17:
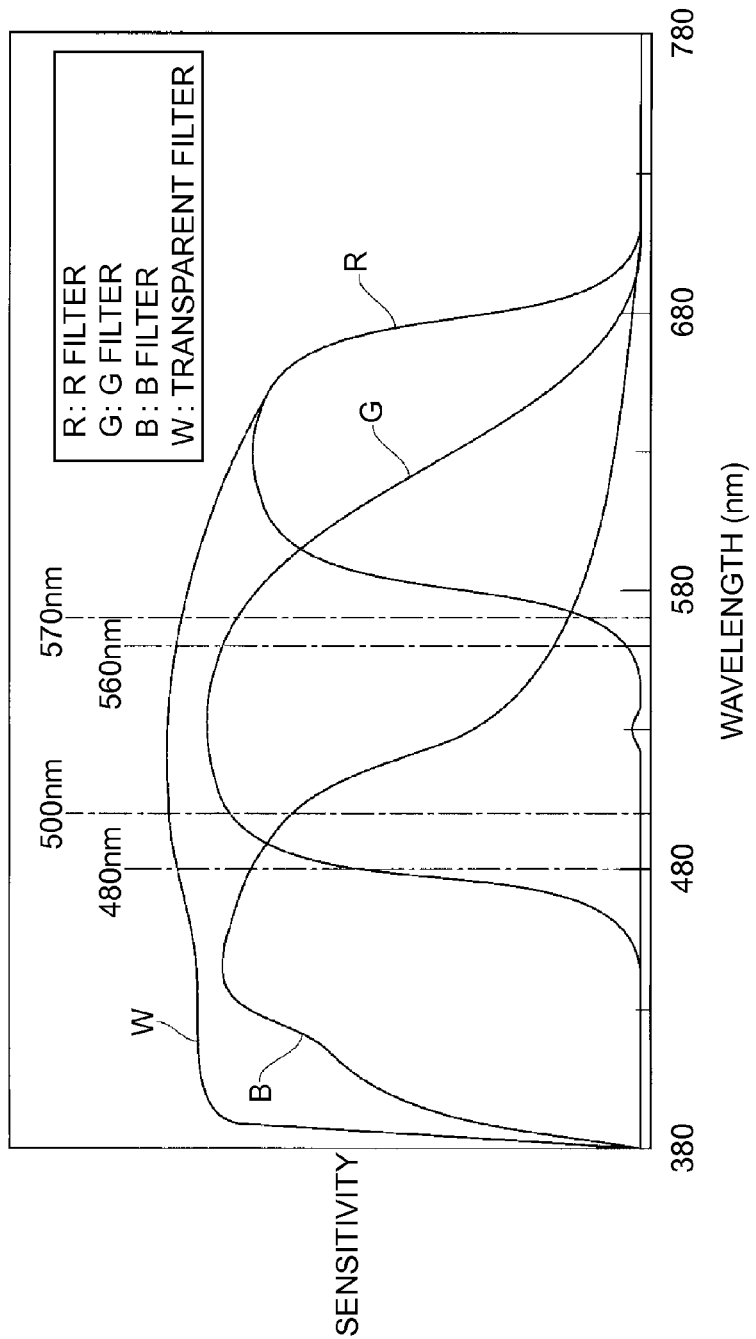
FIG. 17 is a graph showing spectral sensitivity characteristics of a light receiving element provided with R filters, G filters, B filters, and W filters (transparent filters).

In FIG. 17 showing the spectral sensitivity characteristics of the color filter array (light receiving elements), the peak of the transmittance of the transparent filters W (peak of the sensitivity of the white pixels) is in the range of wavelength 480 nm or more and 570 nm or less. The transmittance of the transparent filters W is higher than the transmittance of the RB filters in the range of wavelength 500 nm or more and 560 nm or less. Therefore, the transparent filters W also satisfy the conditions (2) and (3). As with the transparent filters W, the G filters also satisfy the conditions (1) to (3).

In this way, the transparent filters W satisfy the conditions (1) to (3), and the transparent filters W can be used as the first filters of the present invention. In the color filter array, since part of the G filters corresponding to the G color that most contributes to the luminance signals among the three primary colors of RGB are replaced by the transparent filters W, the condition (4) is also satisfied.

Emerald Filters (E Filters)

Although the embodiments mainly illustrate color filters made of color filters corresponding to RGB colors, part of the color filters may be filters of another color, such as filters E corresponding to an emerald (E) color (emerald pixels). Particularly, the emerald filters (E filters) may be arranged in place of part of the first filters (G filters). In this way, using the color filter array of four colors with part of the G filters replaced by the E filters can improve the reproducibility of high frequency components of luminance, can reduce the jagginess, and can improve the resolution.

Figure 18:
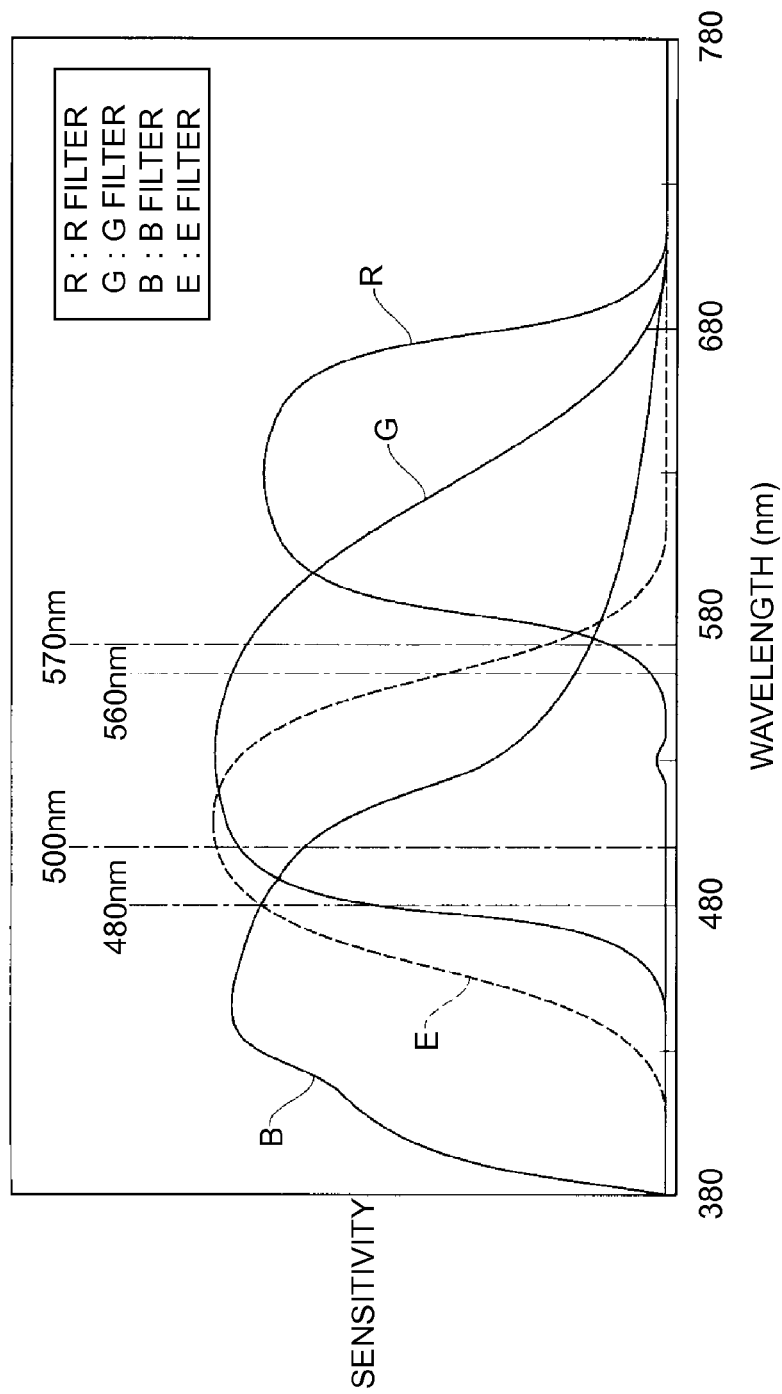
FIG. 18 is a graph showing spectral sensitivity characteristics of a light receiving element provided with R filters, G filters, B filters, and emerald filters E (E filters).
Figure 19:
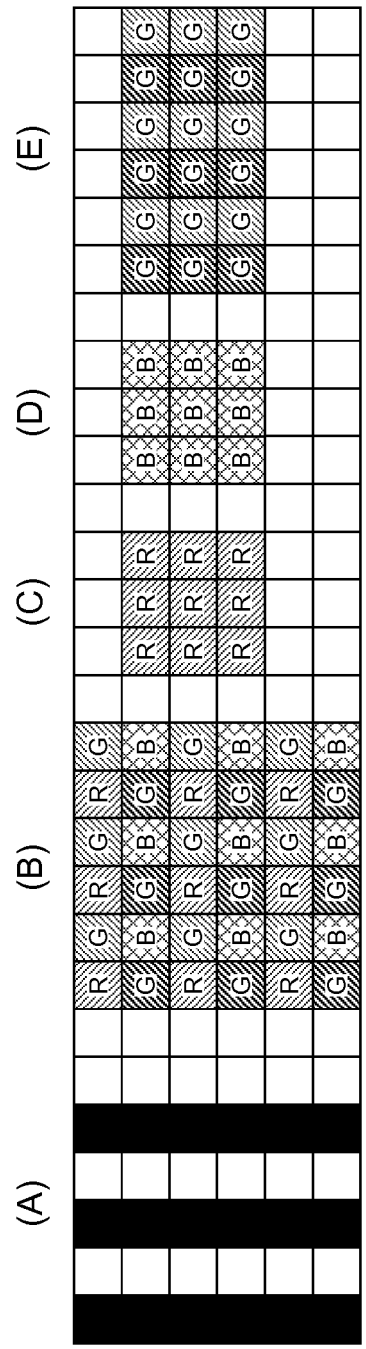
FIG. 19 is a diagram used to explain a problem of a color imaging element with color filters in a conventional Bayer array.

In FIG. 18 showing the spectral sensitivity characteristics of the color filter array (light receiving elements), the peak of the transmittance of the emerald filters E (peak of the sensitivity of the E pixels) is in the range of wavelength 480 nm or more and 570 nm or less. The transmittance of the emerald filters E is in the range of wavelength 500 nm or more and 560 nm or less and is higher than the transmittance of the RB filters. Therefore, the emerald filters E satisfy the conditions (2) and (3). In the color filter array, since part of the G filters corresponding to the G color that most contributes to the luminance signals among the three primary colors of RGB are replaced by the emerald filters E, the condition (4) is also satisfied.

Although the wavelength of the peak of the emerald filters E is shorter than that of the G filters in the spectral characteristics shown in FIG. 18, the wavelength of the peak is longer than that of the G filters (color looks a little closer to yellow) in some cases. In this way, the emerald filters E satisfying the conditions of the present invention can be selected, and for example, the emerald filters E satisfying the condition (1) can also be selected.

Other Types of Color

Although the color filter arrays formed by the color filters of primary colors RGB have been described in the embodiments, the present invention can also be applied to, for example, color filter arrays with color filters of four complementary colors including G in addition to C (cyan), M (magenta), and Y (yellow) that are complementary colors of the primary colors RGB. In this case, color filters satisfying any of the conditions (1) to (4) are the first filters of the present invention, and the other color filters are the second filters.

Although the square grid or diagonal grid basic array patterns corresponding to N×N (N: integer 4 or more) pixels are repeatedly arranged in the horizontal and vertical directions or in the diagonal grid shapes in the color filter arrays of the color imaging element of the embodiments, basic array patterns corresponding to N×M (N, M: integers 4 or more and N≠M) pixels may be repeatedly arranged in the horizontal and vertical directions or in the diagonal grid shapes.

The present invention is not limited to the embodiments, and it is obvious that various changes can be made without departing from the scope of the present invention.

What is claimed is:

1. A single-plate color imaging element including color filters in a specific color filter array arranged on a plurality of pixels formed by photoelectric conversion elements arranged in a diagonal grid shape, wherein
   the color filter array includes a basic array pattern provided with first filters corresponding to a first color with one or more colors and second filters corresponding to a second color with two or more colors with contribution ratios for obtaining luminance signals lower than the first color, the basic array pattern is repeatedly arranged in a diagonal grid shape,
   one or more first filters are arranged in each line in horizontal, vertical, upper right, and lower right directions of the color filter array,
   one or more second filters corresponding to each color of the second color are arranged in each line in the upper right and lower right directions of the color filter array in the basic array pattern, and
   a proportion of the number of pixels of the first color corresponding to the first filters is greater than a proportion of the number of pixels of each color of the second color corresponding to the second filters.

2. The color imaging element according to claim 1, wherein
   the color filter array includes a section where the first filters continue for two or more pixels in each line in the horizontal, vertical, upper right, and lower right directions.

3. The color imaging element according to claim 1, wherein
   the color filter array includes a cross shape array including vertically and horizontally adjacent four pixels formed by the first filters.

4. The color imaging element according to claim 1, wherein
   the color filter array in the basic array pattern is point-symmetric with respect to a center of the basic array pattern.

5. The color imaging element according to claim 1, wherein
   the basic array pattern is a diagonal grid array pattern corresponding to N×N (N: integer 4 or more and 8 or less) pixels.

6. The color imaging element according to claim 5, wherein
   the basic array pattern is a diagonal grid array pattern corresponding to 6×6 pixels.

7. The color imaging element according to claim 1, wherein
   the color filter array includes the first filters arranged at a center and four corners in a diagonal grid array of 3×3 pixels, and the diagonal grid array of 3×3 pixels is repeatedly arranged in a diagonal grid shape.

8. The color imaging element according to claim 1, wherein
   the second filters are arranged in each line in the horizontal, vertical, upper right, and lower right directions of the color filter array.

9. The color imaging element according to claim 1, wherein
   the first color is green (G), and the second color is red (R) and blue (B).

10. The color imaging element according to claim 9, wherein
    the basic array pattern is a diagonal grid array pattern corresponding to 6×6 pixels, and
    the diagonal grid array pattern includes alternately arranged first diagonal grid arrays and second diagonal grid arrays, the first diagonal grid array corresponding to 3×3 pixels, the first diagonal grid array including G filters arranged at a center and four corners, the first diagonal grid array including B filters arranged in the upper right direction across the G filter at the center, the first diagonal grid array including R filters arranged in the lower right direction, the second diagonal grid array corresponding to 3×3 pixels, the second diagonal grid array including G filters arranged at a center and four corners, the second diagonal grid array including R filters arranged in the upper right direction across the G filter at the center, the second diagonal grid array including B filters arranged in the lower right direction.

11. An imaging apparatus comprising the color imaging element according to claim 1.

* * * * *